(12) United States Patent
Erdemir et al.

(10) Patent No.: US 6,548,173 B2
(45) Date of Patent: Apr. 15, 2003

(54) METHOD OF PRODUCE ULTRA-LOW FRICTION CARBON FILMS

(75) Inventors: Ali Erdemir, Naperville, IL (US);
George R. Fenske, Downers Grove, IL (US); Osman Levent Eryilmaz, Istanbul (TK); Richard H. Lee, Lemont, IL (US)

(73) Assignee: Argonne National Laboratory, Argonne, IL (US)

( * ) Notice: Subject to any disclaimer, the term of this patent is extended or adjusted under 35 U.S.C. 154(b) by 0 days.

(21) Appl. No.: 09/808,632

(22) Filed: Mar. 14, 2001

(65) Prior Publication Data

US 2002/0041930 A1 Apr. 11, 2002

Related U.S. Application Data

(63) Continuation of application No. 09/063,284, filed on Apr. 20, 1998, now abandoned.

(51) Int. Cl.[7] .................................................. B32B 9/00
(52) U.S. Cl. .................. 428/408; 423/445 R; 428/336; 428/426; 428/469; 428/446
(58) Field of Search ................................ 428/408, 336, 428/469, 426, 446; 423/445 R

(56) References Cited

U.S. PATENT DOCUMENTS

| | | | |
|---|---|---|---|
| 5,192,523 A | | 3/1993 | Wu et al. |
| 5,198,285 A | | 3/1993 | Aral et al. |
| 5,202,156 A | * | 4/1993 | Yamamoto et al. |
| 5,237,967 A | * | 8/1993 | Willermet et al. |
| 5,427,827 A | | 6/1995 | Shing et al. |
| 5,508,368 A | * | 4/1996 | Knapp et al. |
| 5,594,231 A | * | 1/1997 | Pellicori et al. |
| 5,679,413 A | * | 10/1997 | Petrmichl et al. |
| 5,771,873 A | * | 6/1998 | Potter et al. |
| 6,086,796 A | * | 7/2000 | Brown et al. |

OTHER PUBLICATIONS

Copper, C. V., et al., "The effect of TiN interlayers on the indentation behavior of diamond–like carbon films on alloy and compound substrates," *Surface and Coatings Technology*, vol. 63, pp. 129–134, 1994; published by Elsevier Sequoia. No month.

Erdemir, A., et al., "Effect of source gas and deposition method on friction and wear performance of diamondlike carbon films," *Surface and Coatings Technology*, vol. 94–95, pp. 525–530, 1997; published by Elsevier Science S.A. No month.

Zhang, S., et al., "Processing and Characterisation of Diamondlike Carbon Films," *Institute of Materials*, pp. 303–309, 1997. No month.

Ferrari, A. C., et al., "Interpretation of Raman spectra of disordered and amorphous carbon," *Physical Review B*, vol. 61, No. 20, pp. 14095–14106, May 15, 2000; published by The American Physical Society.

* cited by examiner

*Primary Examiner*—Archene Turner
(74) *Attorney, Agent, or Firm*—Foley & Lardner

(57) ABSTRACT

A method and article of manufacture of amorphous diamond-like carbon. The method involves providing a substrate in a chamber, providing a mixture of a carbon containing gas and hydrogen gas with the mixture adjusted such that the atomic molar ratio of carbon to hydrogen is less than 0.3, including all carbon atoms and all hydrogen atoms in the mixture. A plasma is formed of the mixture and the amorphous diamond-like carbon film is deposited on the substrate. To achieve optimum bonding an intervening bonding layer, such as Si or $SiO_2$, can be formed from $SiH_4$ with or without oxidation of the layer formed.

16 Claims, 23 Drawing Sheets

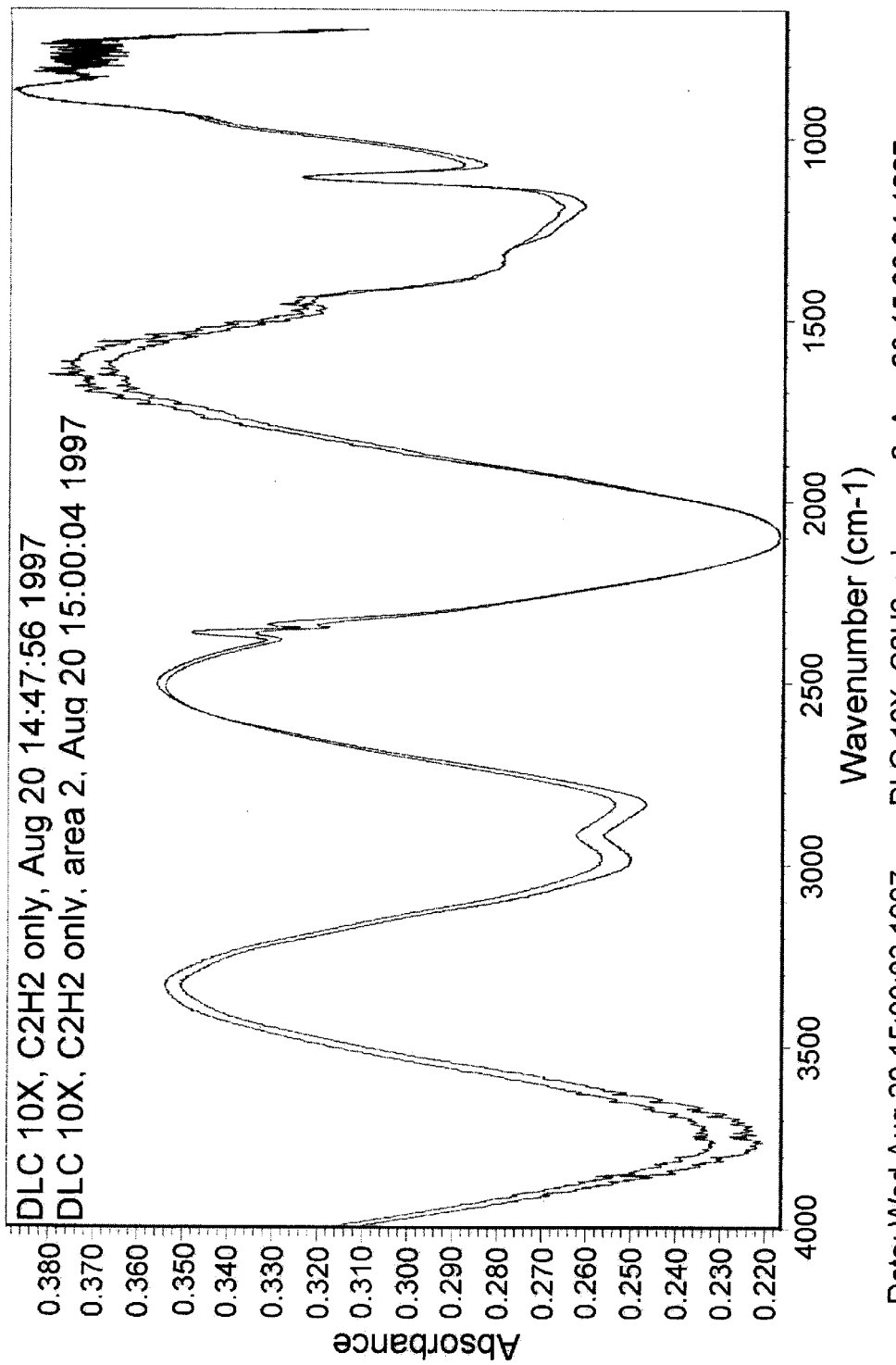
FIG. 3 FTIR Spectrum for a DLC film prepared from C2H2 only.

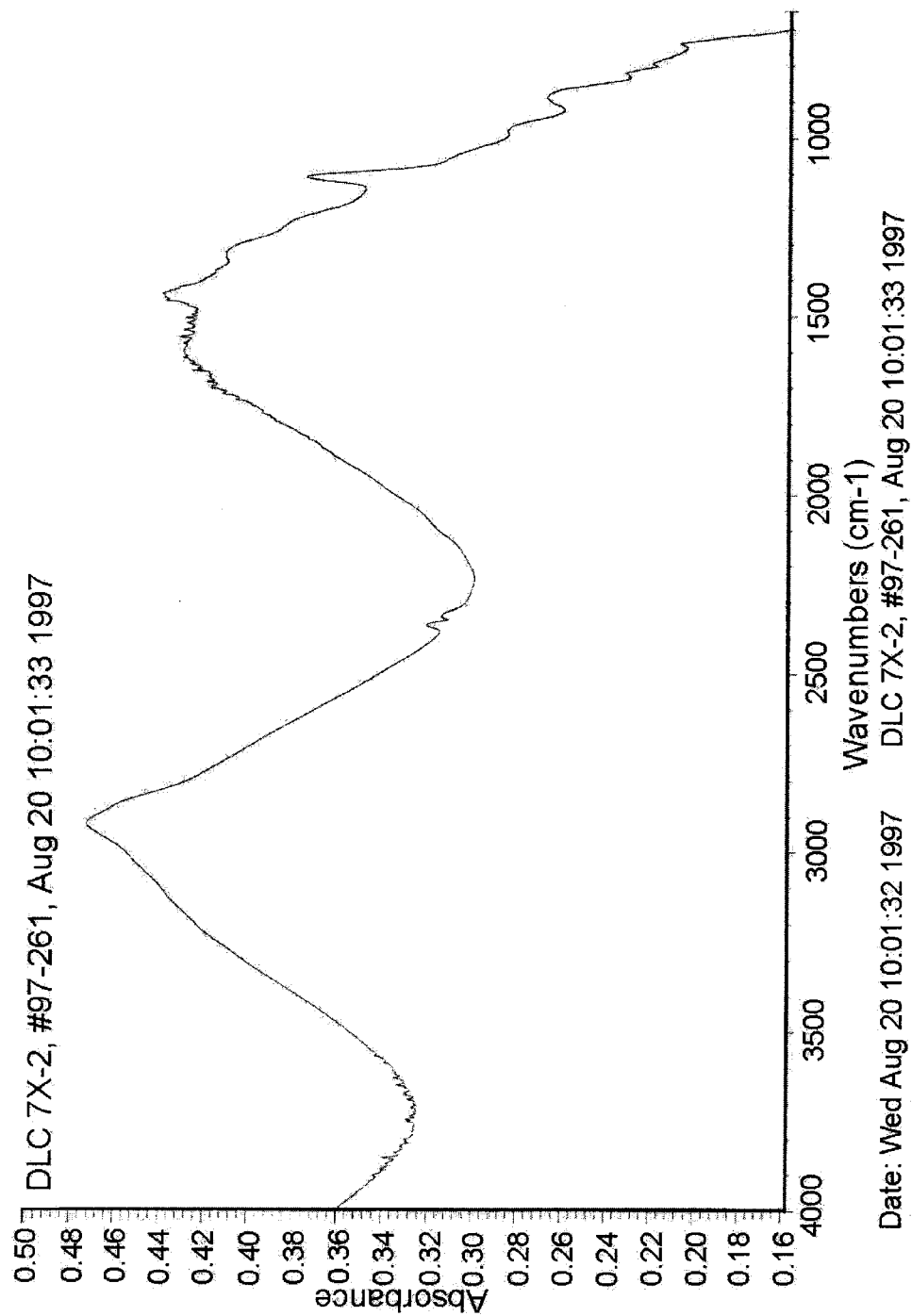
FIG. 4 FTIR Spectrum for a DLC film prepared from CH4 only.

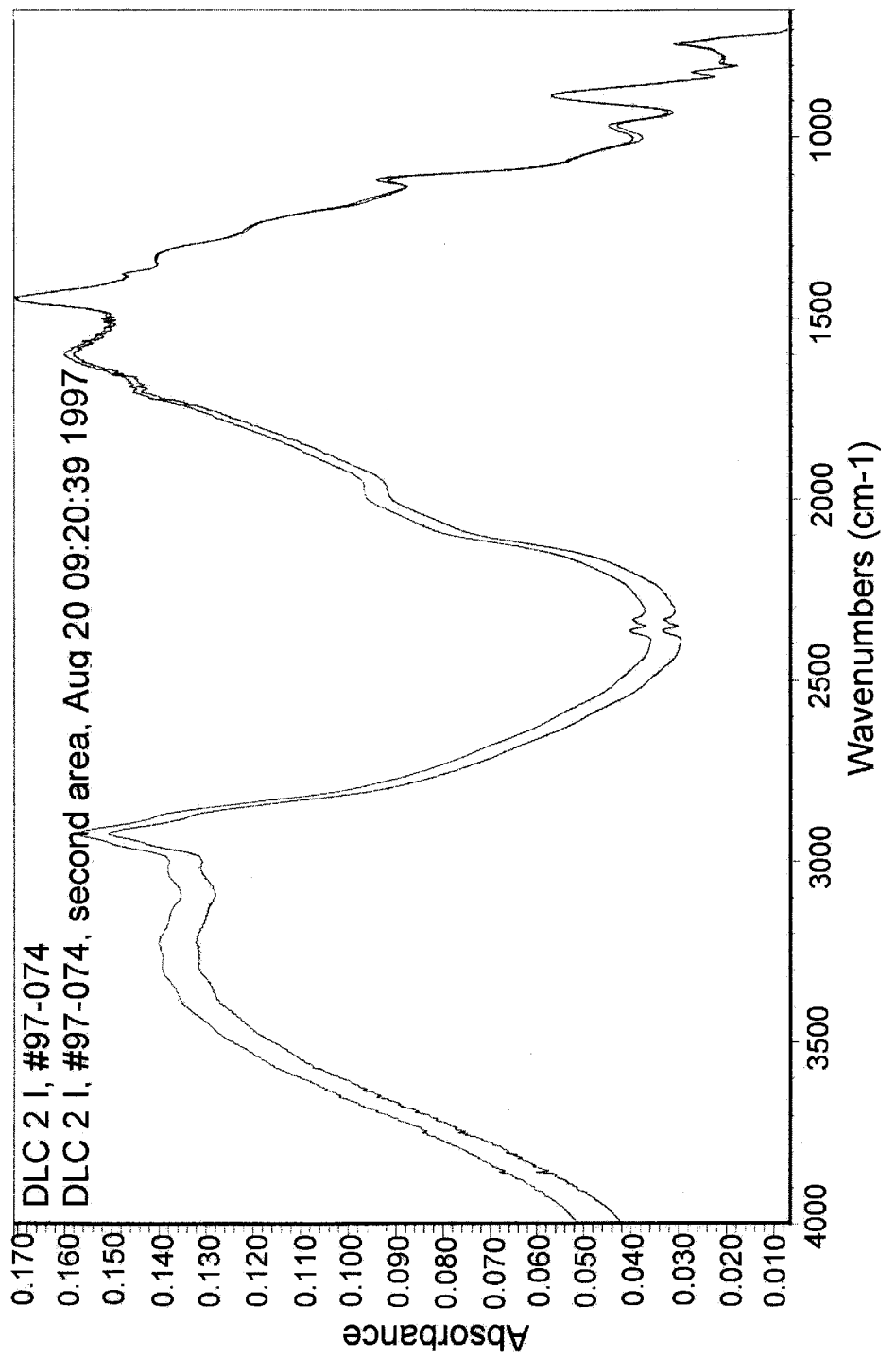
FIG. 5 FTIR Spectrum for a DLC film prepared from 50% H2- 50% CH4.

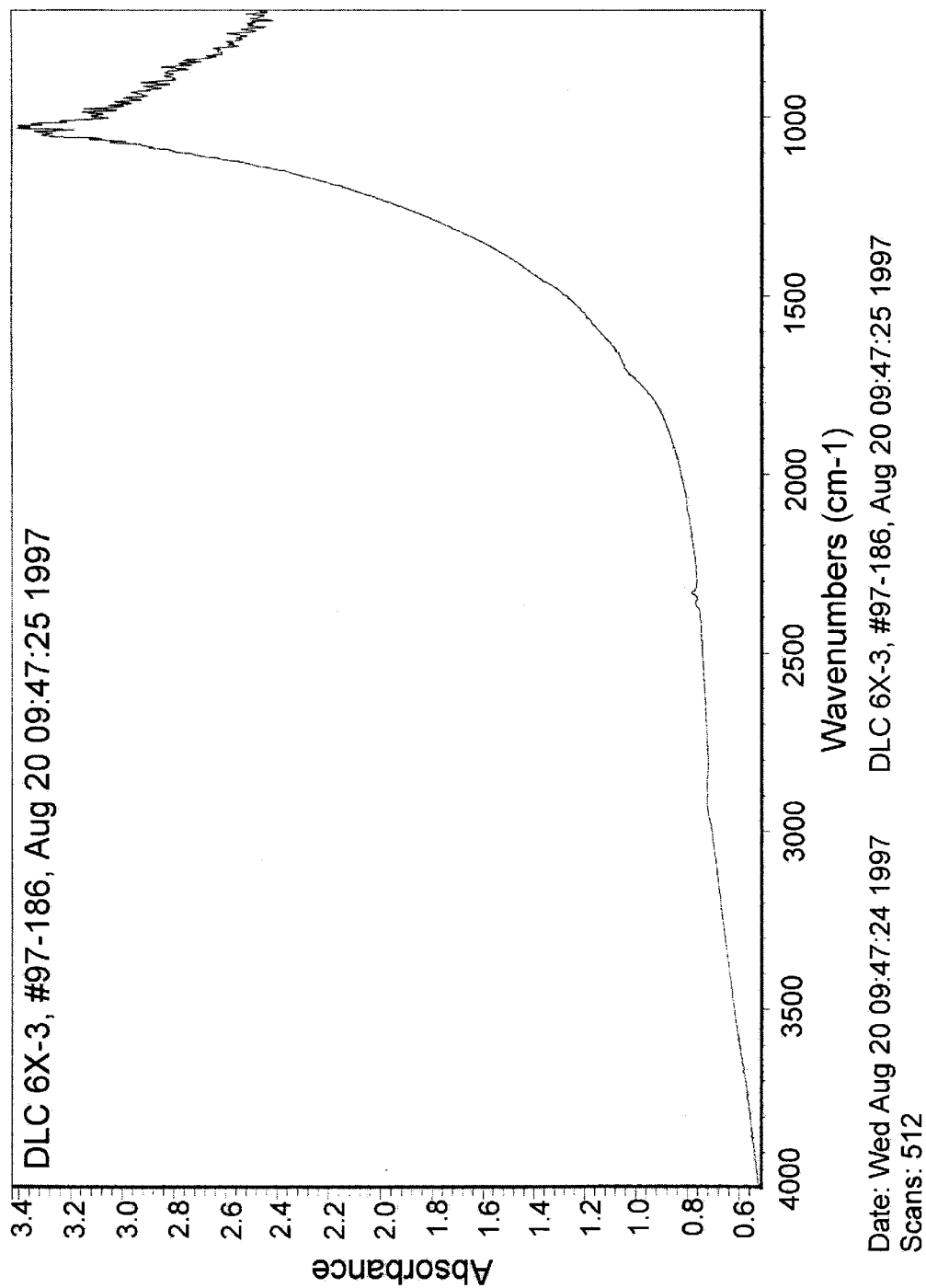
FIG. 6 FTIR Spectrum for a DLC film prepared from 75% H2- 25% CH4.

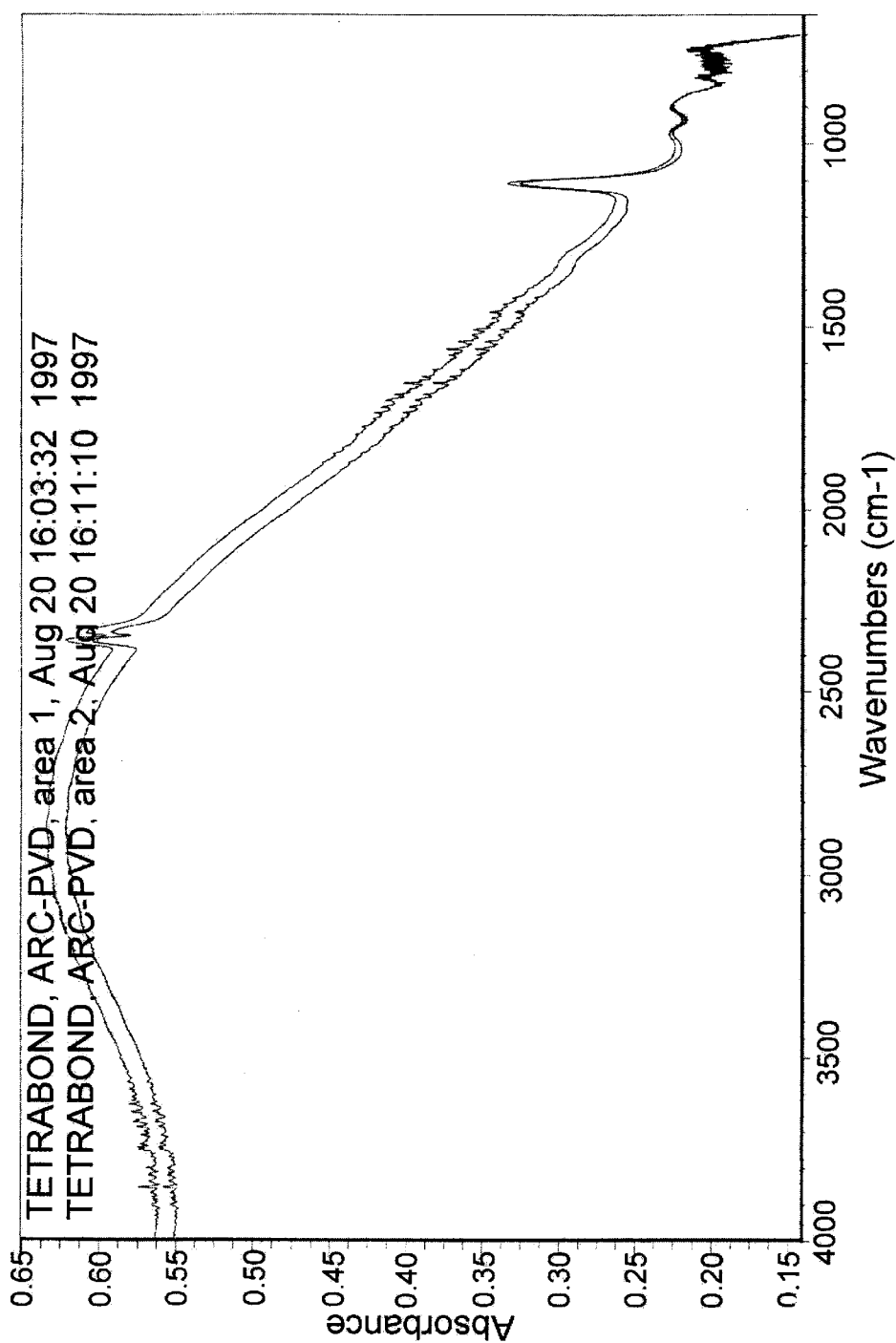
FIG. 7 FTIR Spectrum for a DLC film prepared by Tetrabond Co.

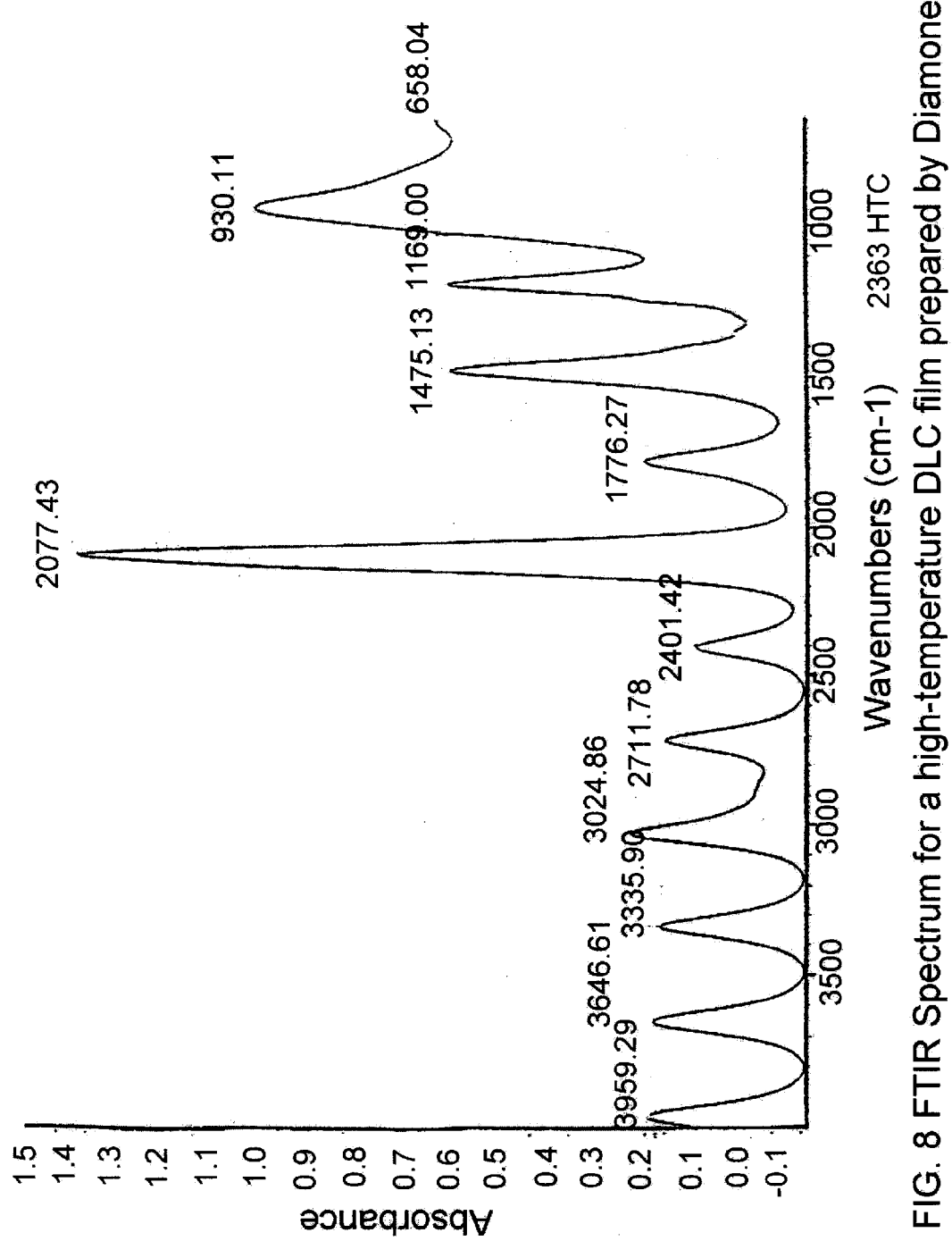
FIG. 8 FTIR Spectrum for a high-temperature DLC film prepared by Diamonex Inc.

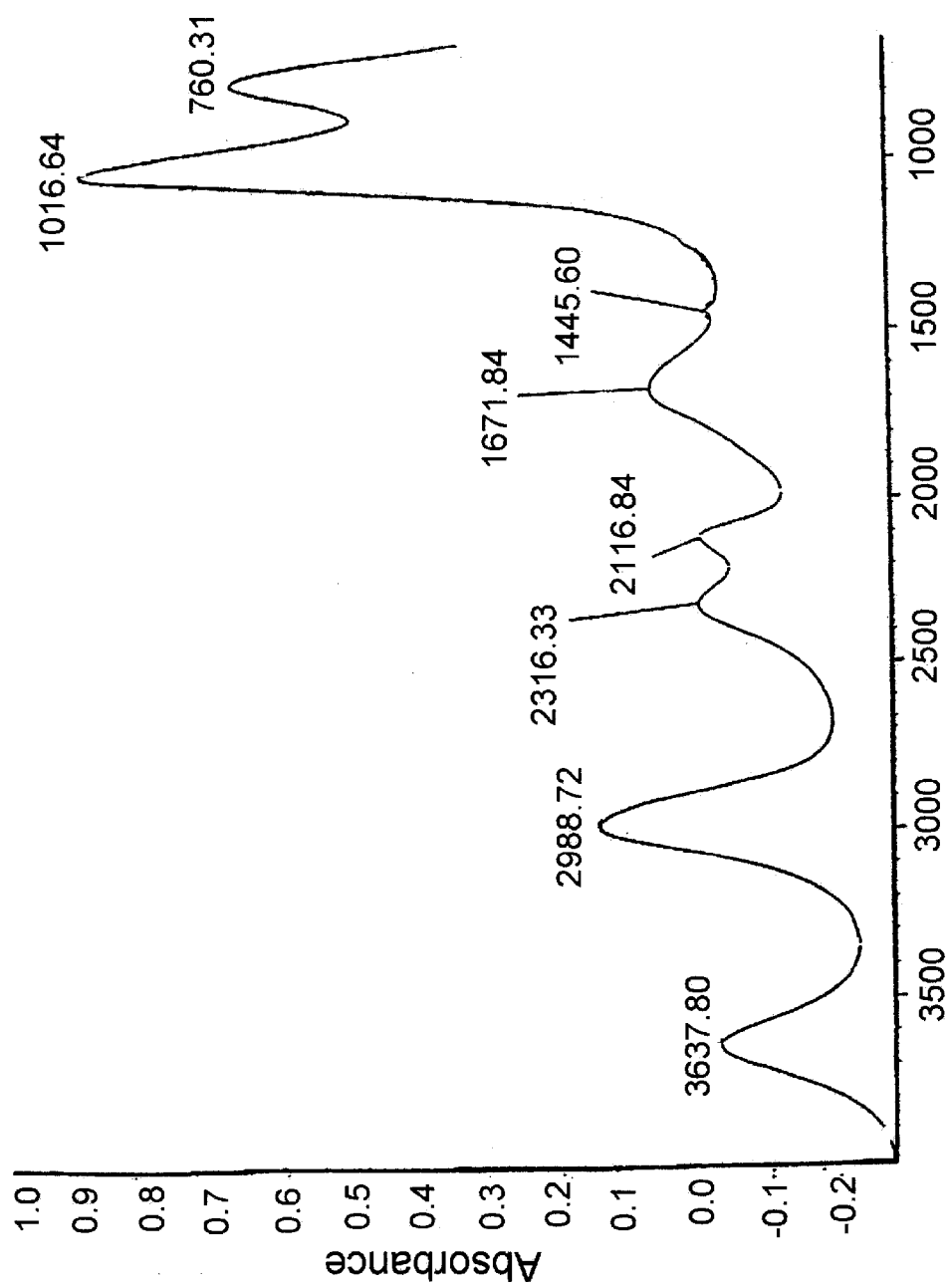
FIG. 9 FTIR Spectrum for a low-temperature DLC film prepared by Diamonex Inc.

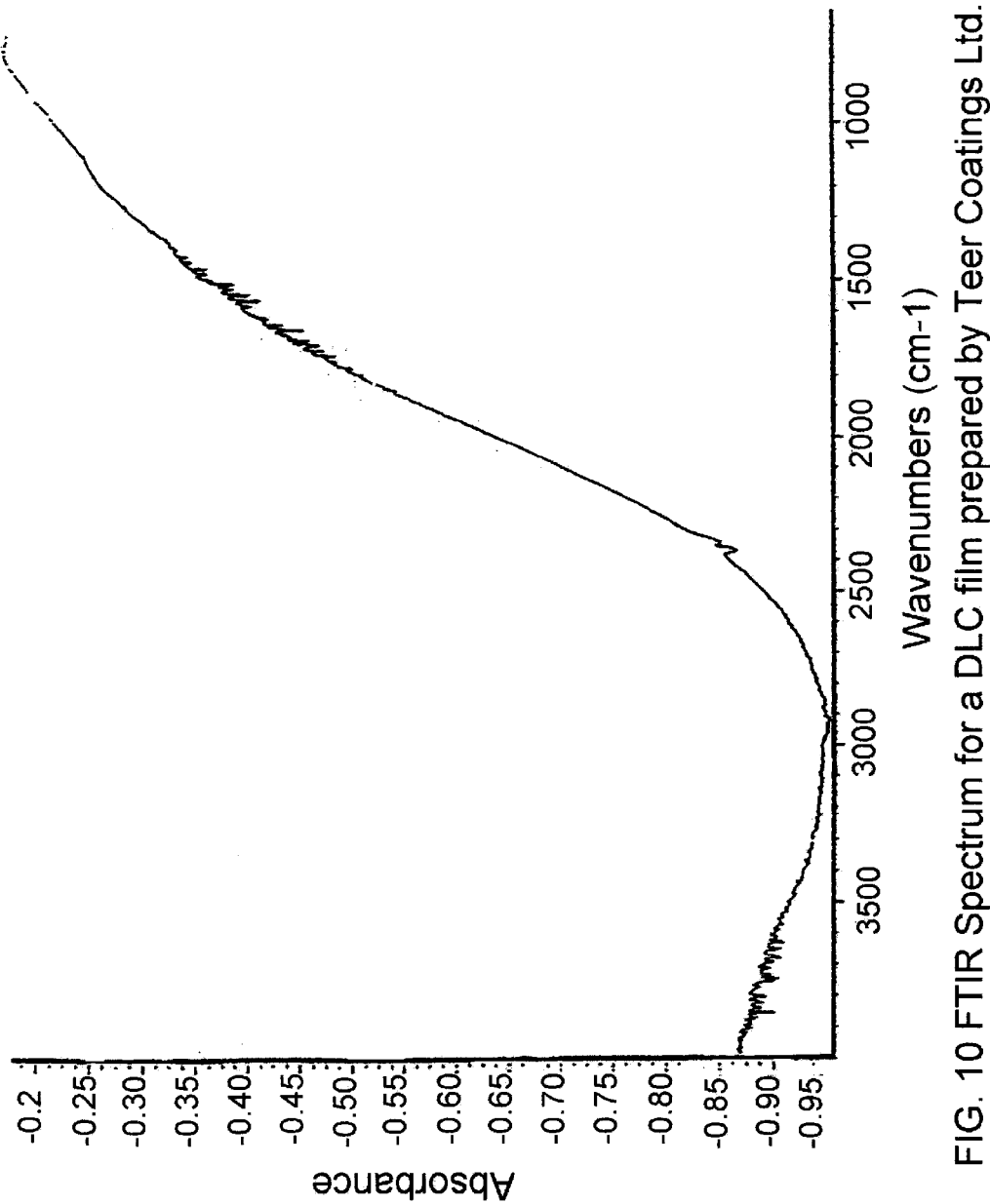
FIG. 10 FTIR Spectrum for a DLC film prepared by Teer Coatings Ltd.

METHOD OF PRODUCE ULTRA-LOW FRICTION CARBON FILMS

This is a continuation of application Ser. No. 09/063,284, filed Apr. 20, 1998, now abandon.

This invention was made with Government support under Contract No. W-31-109-ENG-38 awarded by the Department of Energy. The Government has certain rights in this invention.

The subject invention is generally concerned with a method and article of manufacture of ultra-low friction carbon-based films. More particularly, the invention relates to a carbon containing film grown from a plasma containing about 25–95% hydrogen and about 75–5% of a carbon containing source gas such as methane, acetylene, ethylene, propane and ethane. A plasma activated chemical vapor deposition process is the preferred method but high quality carbon films can also be obtained by magnetron sputtering, ion plating, laser ablation, ion-beam assisted deposition, arc-physical vapor deposition and other vapor deposition processes which take advantage of the use of particular ratios of hydrogen to carbon atoms in the starting gaseous mixture.

A large variety of diamond, diamond-like and amorphous carbon films have been developed for use in applications requiring resistance to mechanical wear, abrasion and corrosive chemical conditions. Some of the carbon-based coatings, such as diamond (hereinafter when used alone means the crystalline form) and amorphous carbon, are currently being evaluated for applications requiring low friction, long wear life, and high resistance to abrasion. Diamond films can be deposited on particular types of substrate materials by a variety of chemical vapor deposition processes at temperature ranging from 700–1000° C. Mechanically, these coating are very hard and abrasion resistant; however, they may contain large diamond grains and/or have non-diamond precursor materials between grains, and some of these surfaces can be very rough. When used in machining or sliding wear applications, they cause high frictional losses and severe wear damage on the initial mating surfaces. In addition, diamond can be deposited on only certain substrates due in part to the high substrate temperatures needed. It is also often necessary to etch or polish these diamond films to obtain a smooth surface finish in order to achieve low friction and wear. In addition, the manufacturing process technology for depositing diamond-like carbon is much better understood and developed, making diamond-like carbon films less expensive to manufacture than diamond deposition processes. Unlike most conventional diamond, amorphous carbon or diamond-like carbon films are extremely smooth and have unique mechanical properties, such as high hardness and resistance to corrosion. In general, these coatings are electrically insulating and can be made optically transparent to visible infrared and ultraviolet lights. Adding to their unique mechanical, chemical, electronic, and optical properties is the very low friction and high wear properties of these coatings. Typical friction coefficients are 0.01 to 0.3, depending on test conditions and deposition methods.

Amorphous carbon films can be deposited at temperatures ranging from sub-zero to 200° C. and at fairly high deposition rates by a variety of methods, including, for example, ion-beam deposition, DC and RF sputtering, arc-plasma, plasma enhanced chemical-vapor-deposition, and laser ablation. Methane, acetylene, and graphite are typically used as sources for carbon, and structurally the resulting carbon films are amorphous. Within their amorphous structure there are also very-short-range-ordered diamond bonds (characterized by $sp^3$-type tetrahedral bonds) and also graphitic phases (characterized by $sp^2$-type trigonal bonds). Hence, these films can be regarded as degenerate forms of bulk diamond and/or graphite. As a result, the reported tribological performance of diamond and amorphous carbon films differ substantially from one study to another. Certain ones of these coatings can become easily graphitized at elevated temperatures, and their wear properties can degrade.

OBJECTS OF THE INVENTION

It is therefore an object of the invention to provide an improved method and article of manufacture of a carbon film.

It is another object of the invention to provide a new method and article of manufacture of a carbon-based film having ultra-low friction coefficients and wear rates.

It is also an object of the invention to provide an improved method and article of manufacture of an amorphous diamond-like carbon film prepared from hydrocarbon and hydrogen gases.

It is a further object of the invention to provide a new method and article of manufacture of a diamond-like carbon film prepared using particular ratios of hydrogen to carbon content in a starting gas to produce ultra-low friction carbon films.

It is yet a further object of the invention to provide an improved method and article of manufacture produced using large amounts of hydrogen compared to the amount of carbon present in a starting gas mixture to form ultra-low friction carbon films.

It is still an additional object of the invention to provide a new method and article of manufacture in which a mixture of hydrogen and carbon containing gas, such as a hydrocarbon, are mixed to produce in a plasma having a carbon to hydrogen atomic molar ratio not more than 0.23, including all hydrogen present in the hydrocarbon as well as $H_2$.

It is an additional object of the invention to provide an improved method and article of manufacture of diamond-like carbon film exhibiting a molecular structure, as characterized by Fourier Transform Infrared (FTIR) Spectroscopy, providing ultra-low friction and wear properties.

It is still another object of the invention to provide a new method and article of manufacture of carbon film with an underlying silicon film, deposited on a substrate, with the film composite exhibiting ultra-low friction and wear properties.

It is also a further object of the invention to provide an improved method and article of manufacture of carbon film disposed on a substrate of one or more of steel, ceramic, plastic, polymers, semiconductors and other solid materials with the carbon film acting to protect the substrate from mechanical wear or chemical corrosion.

These and other objects, features and advantages of the invention will be apparent from the following description of the preferred embodiments and examples, taken in conjunction with the accompanying drawings described below.

BRIEF DESCRIPTION OF THE DRAWINGS

FIG. 3 illustrates a Fourier Transform Infrared ("FTIR") spectrum for a diamond-like carbon ("DLC") film prepared from $C_2H_2$ gas alone;

FIG. 4 illustrates an FTIR spectrum for a DLC film prepared from $CH_4$ alone;

FIG. 5 illustrates an FTIR spectrum for a DLC film prepared from 50% $H_2$/50% $CH_4$;

FIG. 6 illustrates an FTIR spectrum for a DLC film of 75% $H_2$+25% $CH_4$;

FIG. 7 illustrates an FTIR spectrum for a DLC film from Tetrabond Corp. which prepared the film;

FIG. 8 illustrates an FTIR spectrum for a DLC film 2363HTR prepared by Diamonex, Inc.;

FIG. 9 illustrates an FTIR spectrum for a DLC film 2344SC prepared by Diamonex, Inc.;

FIG. 10 illustrates an FTIR spectrum for a DLC TEER-DLC film prepared by Teer Coating, Ltd.;

DETAILED DESCRIPTION OF THE DRAWINGS

Figure 1:
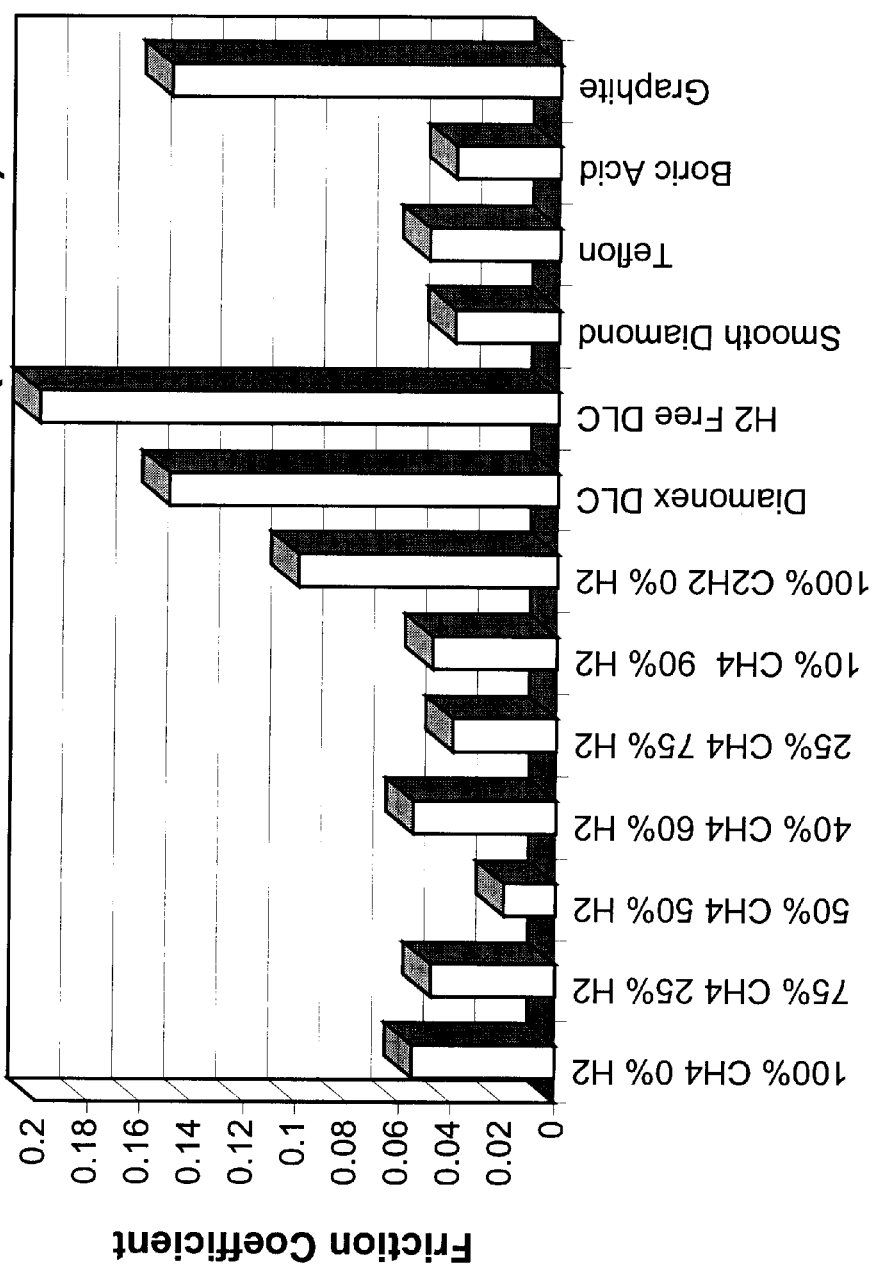
FIG. 1 illustrate a comparison of friction coefficients of carbon-based films of the invention with other well known low friction materials tested in open air.

In one preferred form of the invention, a carbon film is derived from hydrogen rich methane, ethane, ethylene, butane, acetylene or other such hydrocarbon gas discharge plasmas. The resulting films exhibit extremely low coefficients of friction, i.e., on the order of 0.001 to 0.007 when tested in a substantially clean, non-reactive (inert) test environment, such as dry nitrogen or argon (see FIG. 2). In yet another embodiment, reasonably comparable results can also be obtained by use of an ion beam deposition method using hydrocarbon gases, such as methane and acetylene in particular atomic molar ratios of carbon to hydrogen. Similar results can further be obtained using other conventional deposition methods, such as magnetron sputtering, to practice the invention.

The values for coefficient of friction for the most preferred plasma produced film are among the lowest friction values reported for any type of carbon-based materials including graphite, diamond, diamond-like carbon, and other forms of crystalline or amorphous carbon. Other low friction materials (such as $MoS_2$, Teflon™, graphite, etc.) provide friction values of 0.02–0.15 under the same clean test environment conditions used for the ultra low friction films of the invention. A steel surface well-lubricated (by a 10W30 motor oil) gives a friction coefficient of 0.12, while an unlubricated surface has a friction coefficient of about 0.8. The friction coefficients of carbon films of the invention in air are in the range of 0.02 to 0.08, which still are very good for dry sliding.

An important feature of the method and the resulting carbon films is the extremely low wear rates in dry $N_2$ or Ar which are obtained when sliding against steel or ceramic counterfaces (i.e., about $10^{-10}$ to $5\times10^{-11}$-$mm^3$/N·m; these values are 100 to 1000 times lower than those of the materials and coatings mentioned above). The wear rates of a well-lubricated steel surface is $10^{-7} mm^3$/N·m, while that of an unlubricated steel surface is about $10^{-5} mm^3$/N·m. The friction coefficients of the resulting carbon films are believed to be the lowest reported to date for a solid material, and its wear resistance is quite high. Examples of some wear ranges are shown in Tables 1 and 2 below for samples of the invention (and other materials) tested using conventional procedures based on the same testing methodology throughout (and described in the examples).

TABLE 1

Steel Ball Wear Rates ($mm^3$/N.m.)

| Sample | Air | $N_2$ |
| --- | --- | --- |
| DLC7 (100% $CH_4$) | 2.08E-09 | 2.59E-09 |
| DLC8 (25%$H_2$ + 75%$CH_4$) | 1.13E-09 | 2.15E-09 |
| DLC2 (50%$H_2$ + 50%$CH_4$) | 1.50E-09 | 1.92E-10 |
| DLC5 (60%$H_2$ + 40%$CH_4$) | 2.29E-09 | 3.65E-09 |
| DLC6 (75%$H_2$ + 25%$CH_4$) | 4.14E-09 | 3.28E-10 |
| DLC9 (90%$H_2$ + 10%$CH_4$) | 4.20E-09 | 8.35E-10 |
| DLC10 (100%$C_2H_2$) | 3.45E-09 | Severe wear |
| DLC11 (90%$H_2$ + 10%$C_2H_4$) | 2.59E-09 | 3.27E-09 |
| DLC3 (42%$H_2$ + 58%$CH_4$) | 7.02E-09 | 2.01E-07 |
| Uncoated H13 Steel | 2.73E-09 | 4.50E-06 |
| Diamonex | 3.65E-09 | |
| Teer Coating LTD-UK | 3.1E-09 | 8.3E-07 |
| Tetrabond | 1.07E-09 | 7.18E-07 |

TABLE 2

$Si_3N_4$ Ball Wear Rates ($mm^3$N.m.)

| Sample | Air | $N_2$ |
| --- | --- | --- |
| DLC8 (25%$H_2$ + 75%$CH_4$) | | 2.5E-08 |
| Smooth Diamond ($CH_4$ + Ar + $H_2$) Argonne National Laboratory (PCT/US96/16119) | | 1.8E-08 |
| Smooth Diamond (C60) U.S. Pat. No. 5,462,776 | | 1.4E-08 |

In terms of durability or wear life, the film article of manufacture has extremely long endurance life. In a series of lifetime tests under extreme contact pressures (i.e., 1–2 gigapascal, or 145,000–290,000 psi), wear through these films did not occur. In one test, the carbon film accumulated more than 17.5 million sliding cycles (more than 30 days of uninterrupted testing at 400 rpm rotational or 0.5 m/s linear sliding velocity), yet it did not wear through. This film was about 1 micrometer thick and was deposited on a H13 steel and was tested in a clean non-reactive test environment. The friction and wear test machine used in this experiment in fact broke down due to excessive wear of the electrical brushes in its DC motor.

A combination of extreme wear resistance and nearly frictionless nature makes the resulting film article potentially useful for a wide range of industrial applications. The high degree of slipperiness and exceptional wear resistance of the new carbon film render it particularly adapted for reducing friction and wear under severe application conditions which exist in rolling, sliding and rotating mechanical devices such as seals, bearings, spindles, shafts, etc. Film deposition is done at nearly room temperature and at relatively high growth rates so that the physical and mechanical properties of the substrate materials are not adversely affected.

The resulting carbon film can be produced on a wide variety of solid substrates such as metals, ceramics, polymers, and plastics. The method to form the films can involve a variety of vacuum deposition processes including sputtering, ion plating, laser ablation, ion-beam assisted deposition, arc physical vapor deposition, plasma activated chemical vapor deposition, and other such conventional film deposition methods.

The carbon film is most preferably grown in a gas discharge plasma of about 25–95% hydrogen and about 75–5% methane, acetylene, ethylene, propane, ethane, and other such hydrocarbons and carbon containing compounds generally. The ultralow friction carbon films are obtained from plasmas containing large amounts of hydrogen besides carbon bearing source gases (i.e., methane, acetylene, ethylene, propane, ethane, and other such hydrocarbons or carbon containing gases). In general, the higher the carbon to hydrogen atomic molar ratio in the source gas, the higher the amount of hydrogen needed to achieve the lowest friction coefficient. However, it has been determined by test examples that for hydrocarbon gases, optimum properties are obtained for a fairly well defined at molar ratio of carbon to hydrogen. For example, for a methane source gas (which itself alone has a carbon to hydrogen ratio of 0.25), 75% hydrogen in the gas mixture discharge plasma has been determined to be best for achieving the ultralow friction coefficient state. For acetylene (which has a carbon to hydrogen ratio of 1), 90 to 95% hydrogen in the mixture is needed to achieve the same approximate level of ultralow friction coefficients as when using methane. For example, for carbon films prepared from a plasma of 50% hydrogen and 50% methane a resulting coefficient of friction was about 0.004, while a coating prepared in a 60% hydrogen and 40% methane had a coefficient of friction of 0.002. The friction coefficient of films prepared in a 75% hydrogen and 25% methane was 0.001. The friction tests were made in a nitrogen atmosphere (or alternatively in another inert gas atmosphere, such as argon). This value of 0.001 is about 20 to 100 times better that of Teflon, diamond, smooth diamond (polished and fine grained such as produced at Argonne National Laboratory per U.S. Pat. No. 5,462,776 and PCT/US96/16119) and commercial diamond-like carbon films. Tests in an air environment exhibited higher coefficients of friction for the film of preferred embodiments, such as 0.02 to 0.08 (see FIG. 1).

Carbon film coated samples prepared by various methods of the invention were deposited on substrates such as, M50 steel balls and H13 steel flats, or sapphire balls and sapphire disks, or ceramic balls and ceramic disks, and were tested for friction and wear on a ball-and-disk tribometer. The tribometer structure, operation and features can be found in the 1997 edition of the Friction and Wear Testing Source Book of Selected References from ASTM Standards and ASM Handbooks (see G99-Standard Test Method for Wear Testing with a Pin-on-Disk Apparatus, pages 124–128). Test loads ranged from 2 to 10 N and at a sliding velocity of 0.05 to 0.5 m/s. The Vickers hardness of the substrates and balls was approximately 8 Gpa, and the long range overall surface roughness of the test materials was better than 0.1 $\mu$m centerline average (short range is much better). Wear track diameters ranged from 20 to 40 mm, and ambient temperature ranged from 21 to 23° C. Film thickness were typically 1–2 $\mu$m but depositions can readily be extended to larger thicknesses with optimization of deposition conditions.

In our test system, the coated ball samples (9.55 mm in diameter) were secured on the ball-holder of the wear test machine and pressed against the rotating steel disk. A specific load (10 N) is applied through a lever system which presses the stationary pin-holder downward against the rotating disk. The initial contact pressure created by the load is 145,000 psi. After the friction and wear test, the steady-state friction coefficient is obtained from a chart recorder and a microprocessor controlled data acquisition system. The wear rate was calculated from a formula given in the G99 ASTM Standards for wear testing and expressed in cubic millimeter per Newton meter (i.e., $mm^3/N \cdot m$).

EXAMPLES

The following examples are intended to illustrate the unique features of the invention and to highlight the range of deposition conditions under which ultra-low and near-frictionless carbon films are derived. Further, in Examples I–IV and VI given below, the procedure for forming near-frictionless carbon films on steel or other solid substrates involved the use of a plasma activated chemical vapor deposition process. The films can also be formed by other vacuum deposition processes (i.e., sputtering, ion plating, laser ablation, arc physical vapor deposition, and plasma activated chemical vapor deposition, etc.) Example VI is directed to ion-beam deposition methods.

As a recommended procedure for Examples I–IV and VI, the substrates were first sputter-cleaned in an argon arc plasma for 10 to 60 min. by applying a negative RF bias voltage of about 500–700 V to the steel substrates. This negative bias enables a continuous cleaning action to occur and also can lead to densifying the film being deposited. The typical gas pressure (dictated in part by the available pumping speed) is less than 50/mtorr and preferably in the range of 5 to 15 mtorr. The substrates were then coated with a 50–70 n.m. thick bond layer formed using $SiH_4$ to form a silicon gas discharge plasma or by sputtering silicon from a solid silicon target positioned above the substrates. The substrates were not heated, although modest heating (to about 100–150° C.) resulted from the plasma. A $SiH_4$ plasma can be used in a wide range of pressure (preferably about 20 mtorr pressure) as long as the plasma is sustained in the present system. The silicon layer also can be $SiO_2$ formed by a variety of methods and performs well as a bonding layer and in fact is believed to be the stable form of silicon present in the preferred embodiment. Other bonding layers can also function to provide strong bonding of the carbon film to any substrate. Such additional bonding layers can include Cr and Ti oxides. Deposition of carbon films is initiated by using carbon source gases (such as using methane, acetylene, ethane, ethylene, butane and propane) and hydrogen gas which are bled into the chamber to obtain the desired gas composition. By intermixing hydrocarbon gas and $SiH_4$, or like gases for forming a bonding layer, a graded compositional layer can also be formed in alternative embodiments.

It should also be noted that different hydrocarbon gases can be mixed with varying $H_2$ amounts to create graded diamond-like carbon films as well.

In another embodiment the argon and/or $SiH_4$ can be pumped out of the chamber before introducing the hydrocarbon gas. The gas pressure during deposition was maintained between about 10 and 50 mtorr, and the negative RF bias voltage applied to the substrates was approximately 500 V. As can be appreciated, the pressure and bias voltage can be varied while maintaining a stable plasma and still obtain a good quality film.

Transmission electron microscopy revealed that the films for all examples are essentially featureless and structurally amorphous. Fourier Transformed Infrared (FTIR) Spectroscopy indicated that the near-frictionless carbon films of the invention have a distinctly different spectral character than conventional carbon or diamond-like films. In addition, the improved films exhibit a much more absorbing infrared character in general. This is indicative of substantially different molecular bonding states in the resulting films. It was also observed that about 30–40 mole percent $H_2$ was typically retained in the films as measured by ion back scattering (elastic recoil scattering).

Figure 11:
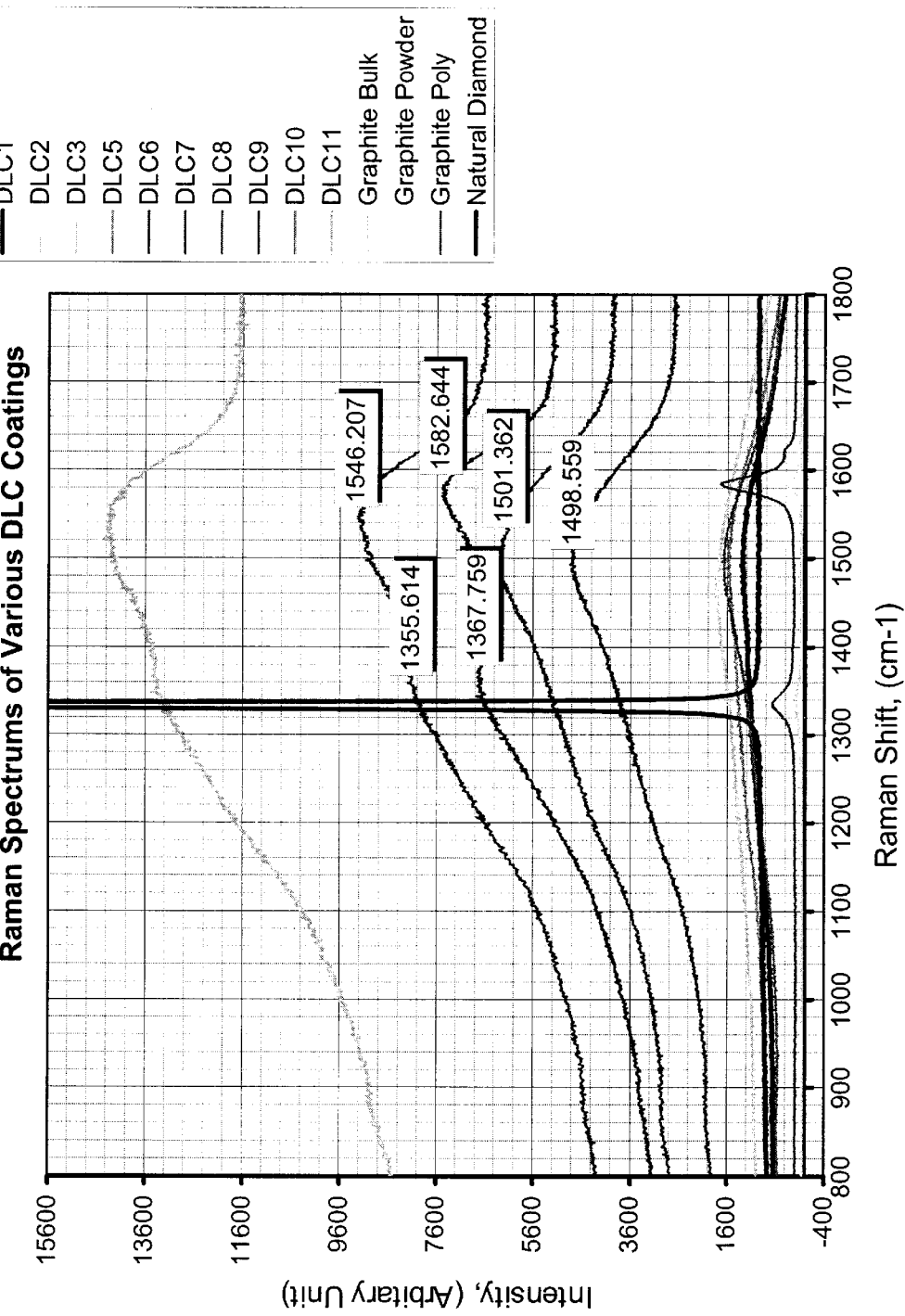
FIG. 11 illustrates a Raman spectrum of a number of DLC films of the invention compared with other materials.

FIGS. 3–10 compare the FTIR spectrum of preferred forms of near-frictionless carbon (for example, FIG. 6) with those of conventional diamond-like films and other low friction films deposited using different gas compositions and under different conditions. Important distinctions can be noted in the near-frictionless carbon film manifested by the FTIR spectra and can be used to identify preferred bonding states involving hydrogen and carbon (see, for example, the characteristic absorption spectrum of the 75% $H_2$/25% $CH_4$ in FIG. 6). In addition, in FIG. 11 is shown Raman spectral data for a number of materials and diamond-like carbon films of the invention with a number of characteristic features further identifying desirable bonding states of the carbon film articles having near frictionless properties.

Table 3 below summarizes the preparation conditions for a number of specimens prepared by gas discharge. Further details are set forth in Examples I–IV hereinafter.

TABLE 3

| | Etching | | Si Coating | | DLC | | | | | | | |
|---|---|---|---|---|---|---|---|---|---|---|---|---|
| | | | | | Gases | | | | | Press. | Power | |
| | Pressure mtorr | Time | Flow $SiH_4$ Sccm/m | Time | $H_2$ Mole % | $CH_4$ Mole % | $SiH_4$ Mole % | Time | Date | Total mtorr | Forward Watts | Power Ref Watts |
| DLC1 | 10.26 | 157 min. | 51.6*0.6 | 30 min. | 40 hydrogen | 40 methane | | 7 hour | 3/18/97 | 27.25 | 840 | 20 |
| DLC2 | 10.29 | 77 min. | Si cathode | 20 min | 40 hydrogen | 40 methane | | 7 hour | 3/25/97 | 27.6 | 850 | 17 |
| DLC2-I | 10.3 | 82 min | 52*0.6 | 25 min | 40.2 | 40 | | 7 hour | 4/1/97 | 29.35 | 960 | 9 |
| DLC2-I-2 | 10.28 | 70 min | 56*0.6 | 20 min | 40.2 | 40 | | 6 hour | 4/3/97 | 29.72 | 950 | 15 |
| DLC2-I-3 | 10.34 | 106 min | 48.9*0.6 | 20 min | 40 | 40 | | 7 hour | 4/29/97 | 28.2 | 1000 | 3 |
| DLC2-I-4 | 10.23 | 10 min | Si cathode | 55 min | 40 | 40 | | 7 hour | 5/28/97 | 30.05 | 1100 | 3 |
| DLC2-I-5 | 10.27 | 30 min | Si cathode | 60 min | 40 | 40 | | 7 hour | 5/30/97 | 30.93 | 1110 | 2 |
| DLC2-I-6 | 10.31 | 38 min | Si cathode | 52 min | 34 | 34 | | 8 hour | 7/7/97 | 30.43 | 1250 | 4 |
| DLC2-I-7 | 10.29 | 15 min | Si cathode | 52 min | 40 | 40 | | 7 hour 10 min | | 27.05 | 900 | 6 |
| DLC2-I-8 | 10.31 | 24 min | Si cathode | 25 min | 0 | 80 | | 7 min | 7/30/97 | 26.36 | 850 | 3 |
| | | | | | 20 | 60 | | 20 min | | 29.53 | 900 | 3 |
| | | | | | 40 | 40 | | 20 min | | 29.35 | 900 | 3 |
| DLC2-II | 10.3 | 50 min | 51.8*0.6 | 25 min | 44 | 44 | | 5 hour 20 | 4/10/97 | 27.18 | 900 | 23 |
| DLC2-III | 10.27 | 35 min | 51.6*0.6 | 24 min | 40 | 40 | | 3 hour 36 | 4/15/97 | 28.39 | 800 | 14 |
| DLC3 | 10.28 | 67 min | 51.4*0.6 | 19 min | 30 hydrogen | 40 methane | 7*0.6 | 6 hour | 3/21/97 | 22.5 | 860 | 26 |
| DLC4 | 10.3 | 60 min | 51.7*0.6 | 20 min | 40 | 40 | | 30 min | 4/7/97 | 28 | 870 | 16 |
| | | | | | 48 | 32 | | 30 min | 4/7/97 | 27.8 | 900 | 16 |
| | | | | | 56 | 24 | | 30 min | 4/7/97 | 27.11 | 905 | 19 |
| | | | | | 60 | 20 | | 5 hour 29 | 4/7/97 | 24.55 | 920 | 22 |
| DLC5 | 10.3 | 70 min | 54*0.6 | 21 min | 35 | 52.5 | | 7 hour | 4/9/97 | 28.4 | 930 | 5 |
| DLC5-II | 10.3 | 65 min | 52*0.6 | 22 min | 48 | 32 | | 7 hour | 4/16/97 | 28.96 | 840 | 12 |
| DLC5-II | 10.3 | 10 min | Si cathode | 54 min | 46 | 31 | | 7 hour | 6/18/97 | 30.56 | 870 | 10 |
| DLC6 | 10.3 | 84 min | Si cathode | 56 min | 0 | 80 | | 66 min | 7/26/97 | 23.26 | 800 | 11 |
| DLC6 | 10.29 | 60 min | Si cathode | 51 min | 0 | 80 | | 60 min | | 22.9 | 800 | 6 |
| | | | | | 40 | 40 | | 30 min | | 27.12 | 800 | 9 |
| | | | | | 60 | 21 | | 45 min | | 28.99 | 850 | 9 |
| DLC6-1 | 2.34 | 24 min | Si cathode | 19 min | 60 hydrogen | 20 methane | | 7 hour | 5/16/97 | 28.6 | 1050 | 3 |
| DLC6-2 | 10.3 | 28 min | Si cathode | 158 min | 60 hydrogen | 20 methane | | 7 hour | 5/21/97 | 33.5 | 1000 | 2 |
| DLC6-3 | 10.25 | 32 min | Si cathode | 54 min | 60 hydrogen | 20 methane | | 6.5 hour | 5/21/97 | 28.05 | 1090 | 4 |
| DLC6-4 | 10.25 | 7 min | Si cathode | 59 min | 60 hydrogen | 20 methane | | 7 hour | 5/29/97 | 30.27 | 1150 | 3 |
| DLC6-5 | 10.28 | 60 min | Si cathode | 38 min | 60 | 20 | | 7 hour | | 29.7 | 900 | 8 |
| DLC7-1 | 10.27 | 10 min | Si cathode | 51 min | 0 hydrogen | 80 methane | | 7 hour | 6/4/97 | 29.2 | 1100 | 3 |
| DLC7-2 | 10.28 | 20 min | Si cathode | | 0 hydrogen | 80 methane | | 4 hour | | 30.46 | 1100 | 3 |
| DLC8 | 10.3 | 25 min | Si cathode | 55 min | 20 hydrogen | 60 methane | | 5 hour | 6/11/97 | 31.7 | 1050 | 30 |
| DLC9 | 10.3 | 15 min | Si cathode | 47 min | 40 | 40 | | 30 min | 6/16/97 | 30.13 | 850 | 34 |
| | | | | | 48 | 32 | | 35 min | | 27.4 | 850 | 34 |
| | | | | | 51.3 | 22 | | 30 min | | 28.38 | 850 | 32 |
| | | | | | 60 | 15 | | 35 min | | 30 | 850 | 35 |
| | | | | | 68 | 8 | | 10 hour | | 30.7 | 860 | 31 |
| DLC10 | 10.3 | 60 min | Si cathode | 56 min | 0 | $80 C_2H_2$ | | 147 min | | 3.8 | 645 | 23 |

Example I

Figure 2A:
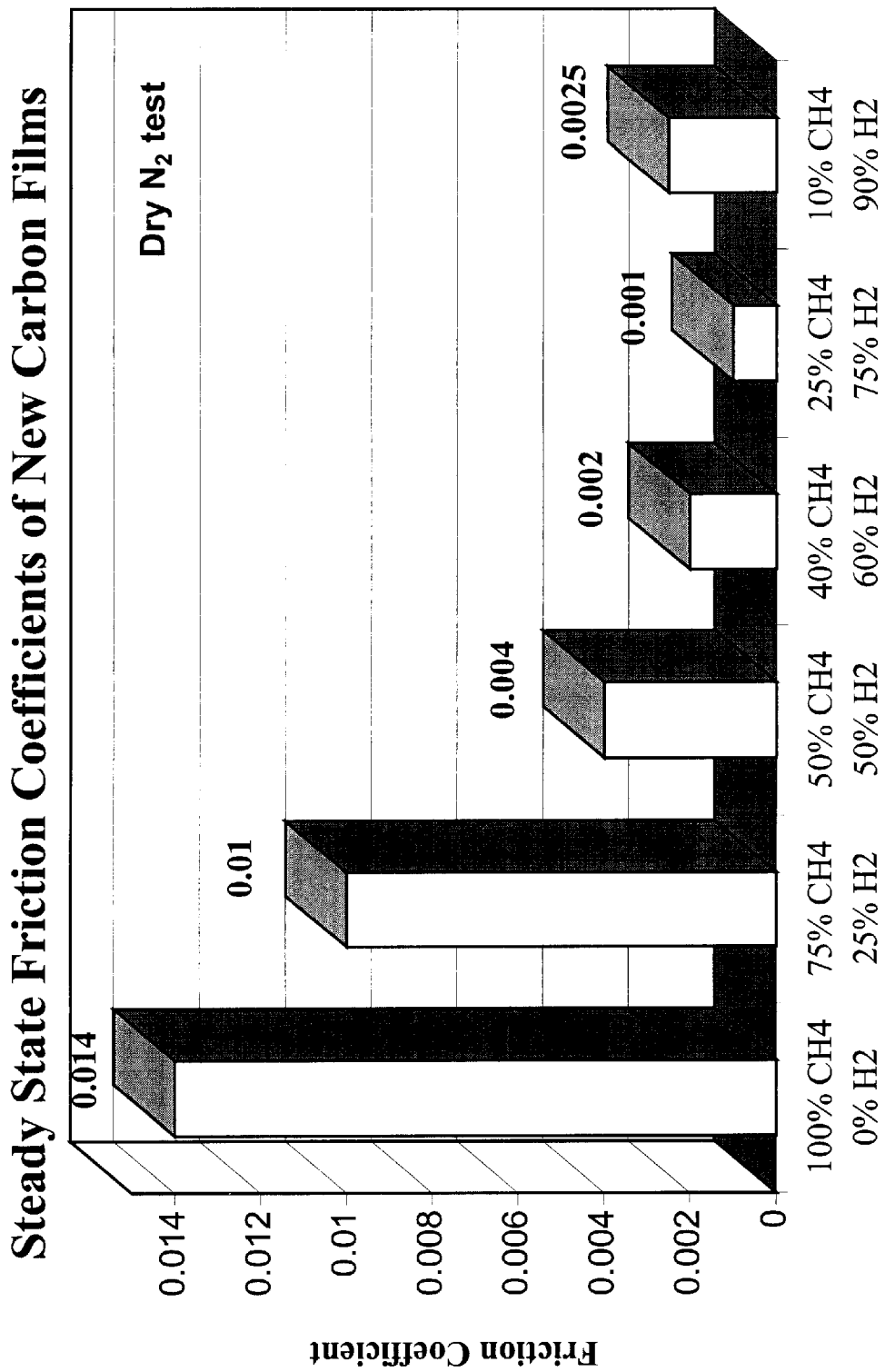
FIG. 2A illustrate a comparison of friction coefficients of carbon-based films of the invention and FIG. 2B shows two other diamond-like films compared to a film of the invention, all tested dry $N_2$.
Figure 2B:
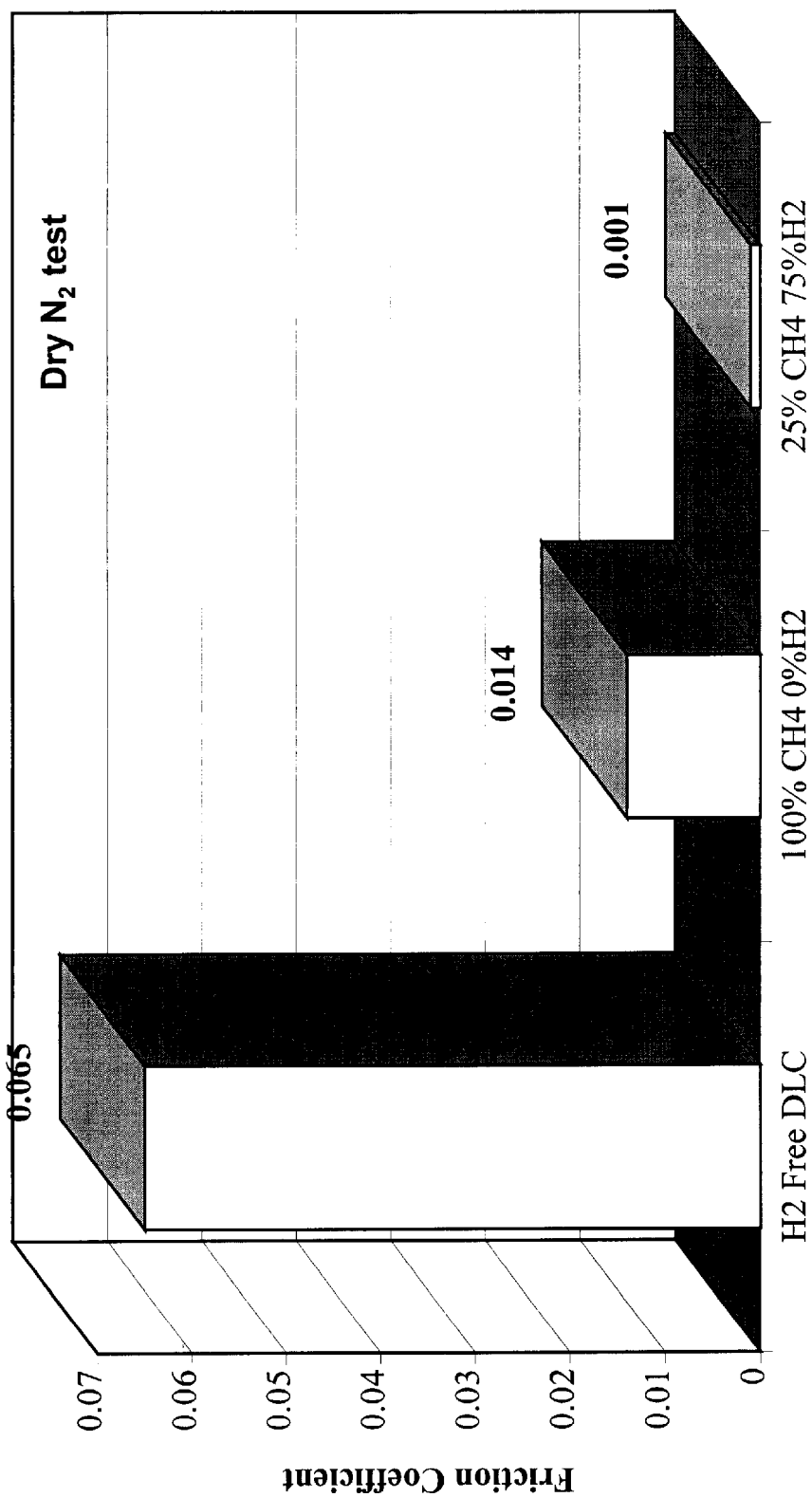

This example illustrates the friction and wear performance of carbon films derived from a hydrogen-methane gas discharge plasmas. Specifically, it shows that when methane is chosen as the carbon source, the friction coefficient of carbon films generally decreases with increasing amount of hydrogen in the plasma (however, see FIG. 2A showing an apparent minimum exists in friction coefficient). For the deposition of these carbon films, we used a commercially available plasma activated chemical vapor deposition system (Perkin Elmer 2400, from Perkin Elmer Corp.). Table 4 summarizes the range of methane/hydrogen used and resulting film properties measured in accordance with previously described well known techniques.

TABLE 4

Effect of hydrogen on friction and wear properties of carbon films derived from methane ($CH_4$). Test conditions: Load: 10 N, Speed, 0.5 m/s; Temperature, 22–23° C.; test environment: dry $N_2$.

| Carbon Films Grown in | Friction Coefficients | Ball Wear Rates | C/H Ratio in Plasma |
| --- | --- | --- | --- |
| 100% Methane | 0.014 | 9.00E-09 | 0.25 |
| 25% Hydrogen + 75% Methane | 0.01 | 7.36E-09 | 0.214 |
| 50% Hydrogen + 50% Methane | 0.004 | 1.23E-08 | 0.1666 |
| 60% Hydrogen + 40% Methane | 0.002 | 4.75E-09 | 0.142 |
| 75% Hydrogen + 25% Methane | 0.001 | 4.60E-10 | 0.1 |
| 90% Hydrogen + 10% Methane | 0.0025 | 2.82E-10 | 0.045 |

Table 5 (and FIG. 2) compare the friction coefficient of the carbon film of Example I with those of known low friction materials as well as commercially available diamond-like carbon (DLC) films. Also see FIG. 1 for comparisons in ambient air.

TABLE 5

Comparison of frictional properties of new carbon film with those of the known low friction materials and commercially available diamond-like carbon (DLC) coatings.

| Other Low Friction Materials | Friction Coefficient |
| --- | --- |
| Commercial DLC (Teer Coatings, Ltd.) | 0.15 |
| Commercial DLC 2 (Diamonex Inc.) | 0.02 |
| Commercial DLC 3 (Tetrabond Corp.) | 0.06 |
| Teflon | 0.04 |
| Graphite | 0.15 |
| 75% Hydrogen + 25% Methane (preferred embodiment) | 0.001 |

Example II

In this example, acetylene was used as the carbon source. The film deposition parameters and friction and wear test conditions were kept the same as in Example I. Table 6 summarizes the results of friction and wear tests on acetylene-grown carbon films.

TABLE 6

Effect of hydrogen on friction and wear properties of carbon films derived from acetylene ($C_2H_2$). Test conditions: Load: 10 N, Speed, 0.5 m/s; Temperature, 22–23° C.; test environment: dry $N_2$.

| Carbon Films Grown in | Friction Coefficient | Wear Rates of Balls ($mm^3$/N- m) | C/H Ratio in Plasma |
| --- | --- | --- | --- |
| 100% Acetylene | — | $7.5 \times 10^{-7}$ | 1 |
| 20% Hydrogen + 80% Acetylene | 0.03 | — | 0.8 |
| 25% Hydrogen + 75% Acetylene | 0.027 | $6.86 \times 10^{-4}$ | 0.75 |

TABLE 6-continued

Effect of hydrogen on friction and wear properties of carbon films derived from acetylene ($C_2H_2$). Test conditions: Load: 10 N, Speed, 0.5 m/s; Temperature, 22–23° C.; test environment: dry $N_2$.

| Carbon Films Grown in | Friction Coefficient | Wear Rates of Balls ($mm^3$/N- m) | C/H Ratio in Plasma |
| --- | --- | --- | --- |
| 50% Hydrogen + 50% Acetylene | 0.0175 | $2.53 \times 10^{-7}$ | 0.5 |
| 75% Hydrogen + 25% Acetylene | 0.004 | — | 0.25 |
| 90% Hydrogen + 10% Acetylene | 0.003 | $2.86 \times 10^{-10}$ | 0.0833 |

Example III

In this example, ethane gas was used as the carbon source. The rest of the film deposition parameters and friction and wear test conditions were kept the same as in Example I. Table 7 summarizes the results of friction and wear tests on ethane-grown carbon films.

TABLE 7

Effect of hydrogen on friction and wear properties of carbon films derived from ethane ($C_2H_6$). Test conditions: Load: 10 N, Speed, 0.5 m/s; Temperature, 22–23° C.; test environment: dry $N_2$.

| Carbon Films Grown in | Friction Coefficient | Wear Rates of Balls ($mm^3$/N- m) | C/H Ratio in Plasma |
| --- | --- | --- | --- |
| 100% Ethane | — | $8.75 \times 10^{-8}$ | 0.333 |
| 25% Hydrogen + 75% Ethane | 0.015 | $2.71 \times 10^{-8}$ | 0.3 |
| 50% Hydrogen + 50% Ethane | 0.0073 | $3.34 \times 10^{-8}$ | 0.25 |
| 90% Hydrogen + 10% Ethane | 0.003 | $2.86 \times 10^{-10}$ | 0.0833 |

Example IV

In this example, ethylene gas was used as the carbon source. The rest of the film deposition parameters and friction and wear test conditions were kept the same as in Example I. Table 8 summarizes the results of friction and wear tests on ethylene-grown carbon films.

TABLE 8

Effect of hydrogen on friction and wear properties of carbon films derived from ethylene $C_2H_4$. Test conditions: Load: 10 N, Speed, 0.5 m/s; Temperature, 22–23° C.; test environment: dry $N_2$.

| Carbon Films Grown in | Friction Coefficient | Wear Rates of Balls ($mm^3$/N- m) | C/H Ratio in Plasma |
| --- | --- | --- | --- |
| 100% Ethylene | 0.027 | $1.3 \times 10^{-7}$ | 0.5 |
| 50% Hydrogen + 50% Ethylene | 0.02 | $7.12 \times 10^{-8}$ | 0.4 |
| 75% Hydrogen + 25% Ethylene | 0.004 | $8.4 \times 10^{-10}$ | 0.2 |
| 90% Hydrogen + 10% Ethylene | 0.01 | — | 0.0909 |

Figure 12:
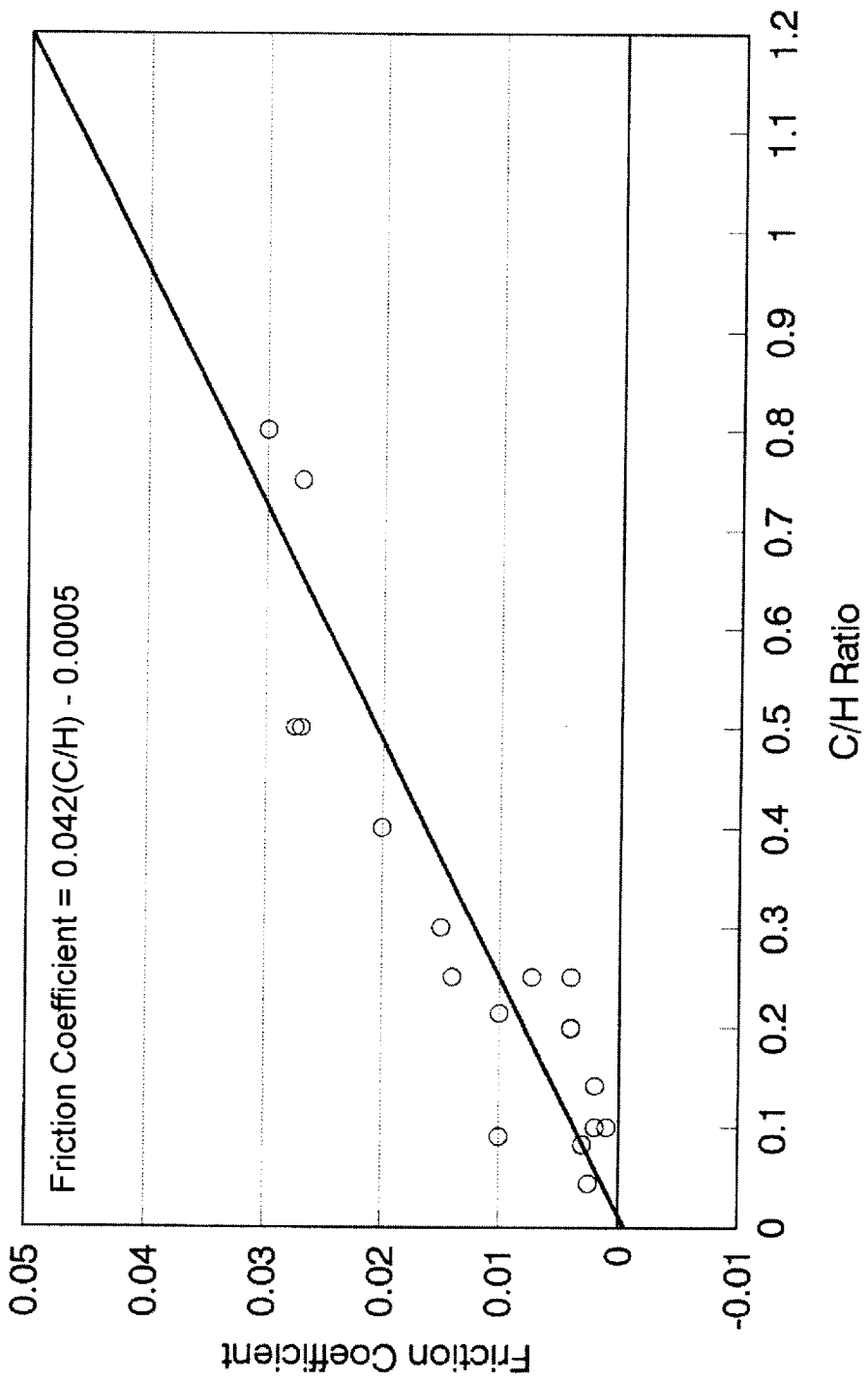
FIG. 12 illustrates the relationship between the C/H atomic molar ratio and friction coefficient of DLC films of the invention.

As can be noted, increasing the amount of hydrogen in the gas discharge plasma plays an important role in friction and wear behavior of the resultant carbon films. In all cases, friction and wear in general undergoes a decrease as the hydrogen content of the gas discharge plasma increases but then turns back up beyond a particular hydrogen molar relationship(see FIG. 12 which plots data including both $H_2$ and hydrogen in the hydrocarbon) to carbon atomic molar relationship. FIG. 12 is based on the data presented in Tables 4 and 6–8 and other recited data in the specification. This plot shows the substantially linear correlation generally between the friction coefficient and the C/H atomic molar ratio. One can also obtain additional interesting information on the role of $H_2$ gas content alone in a plot of carbon to hydrogen ratio.

Example V

Carbon films in this example were prepared using ion beams of methane and acetylene. Conventional ion sources were used to produce an ionizable carbon containing gas which upon ionization enabled acceleration of ions to a substrate to form diamond-like carbon in accordance with the invention. The resulting diamond-like carbon samples were tested for friction and wear on a ball-and-disk tribometer, under a 5 N load and AISI 440C bearing steel balls that were 9.5 mm in diameter. The Vickers hardness of the substrates and balls was approximately 8 Gpa and the surface roughness of the test materials was better than 0.1 $\mu$m centerline average (CLA). Each coating was tested twice in open air (26–44% relative humidity) and dry $N_2$ (0% humidity), under both mild and severe wear conditions. The mild wear conditions consisted of a 100-m sliding distance at 0.1 m/s, and for the severe wear conditions, the sliding tests were run at 0.6 m/s for 10,000 m. Wear track diameters ranged from 20 to 40 mm and ambient temperature ranged from 21 to 23° C. A surface profilometer was used to scan the surface and assess roughness, and the wear volume of the steel balls was determined using a reflected light optical microscope. Cross-sectional measurements of the wear scars were taken, and the wear volume was calculated by using these measurements and the diameter of the ball in the equation: $W_b = 3.14d^4/64r$, where r is the ball radius, d is the diameter of the wear scar, and $W_b$ is the wear volume. A simplifying assumption was made that the wear scar was substantially flat.

Figure 13:
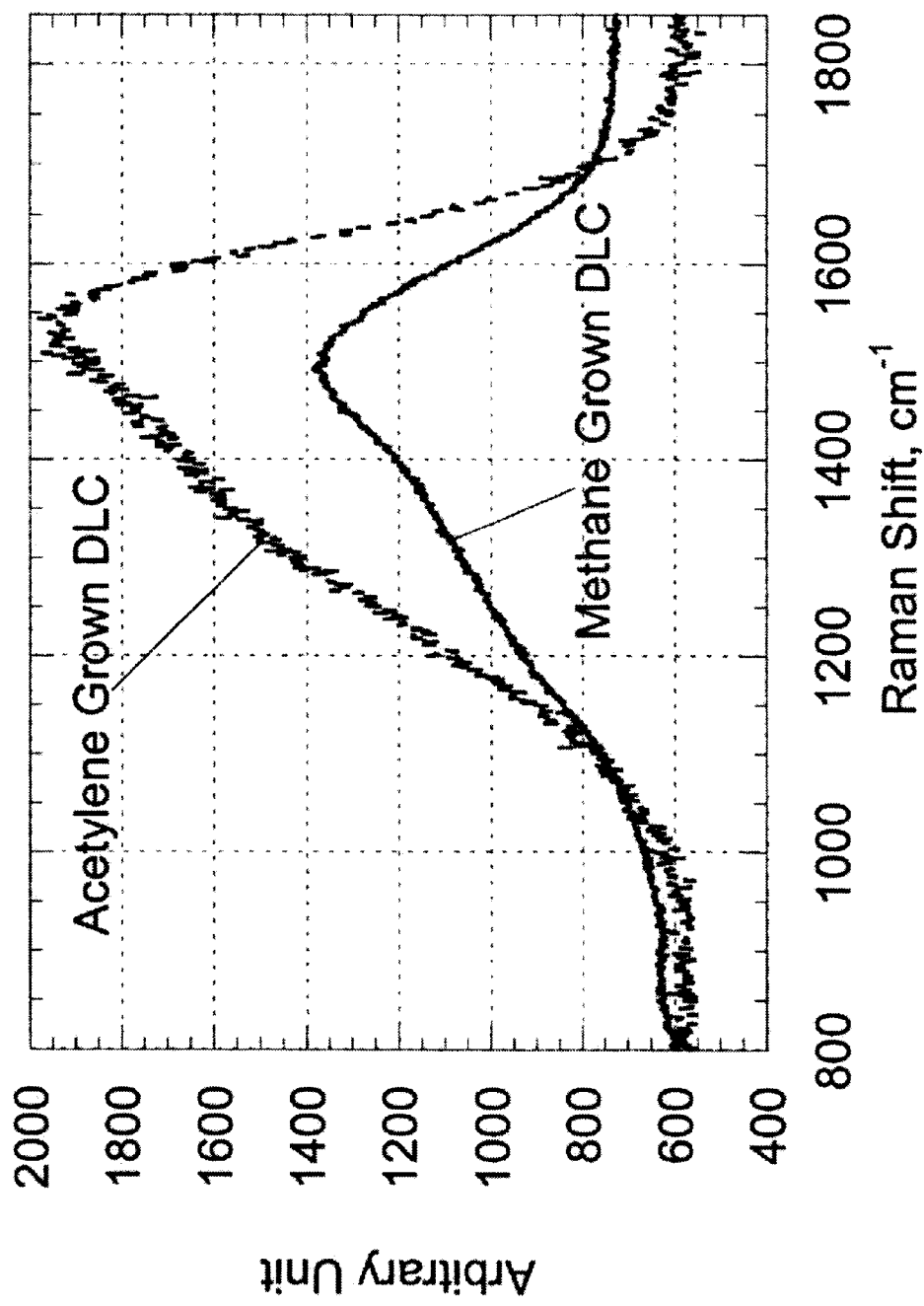
FIG. 13 illustrates a Raman spectrum for DLC films prepared by ion beam deposition using acetylene and methane carbon source gases.

FIG. 13 shows the Raman spectra of films derived from use of methane and acetylene gases for the ion-beam deposition ("IBD") methodology. These spectra reveal a broad peak at $\approx 1560$ cm$^{-1}$ and a shouldered peak at $\approx 1350$ cm$^{-1}$ that is difficult to discern.

Figure 14A:
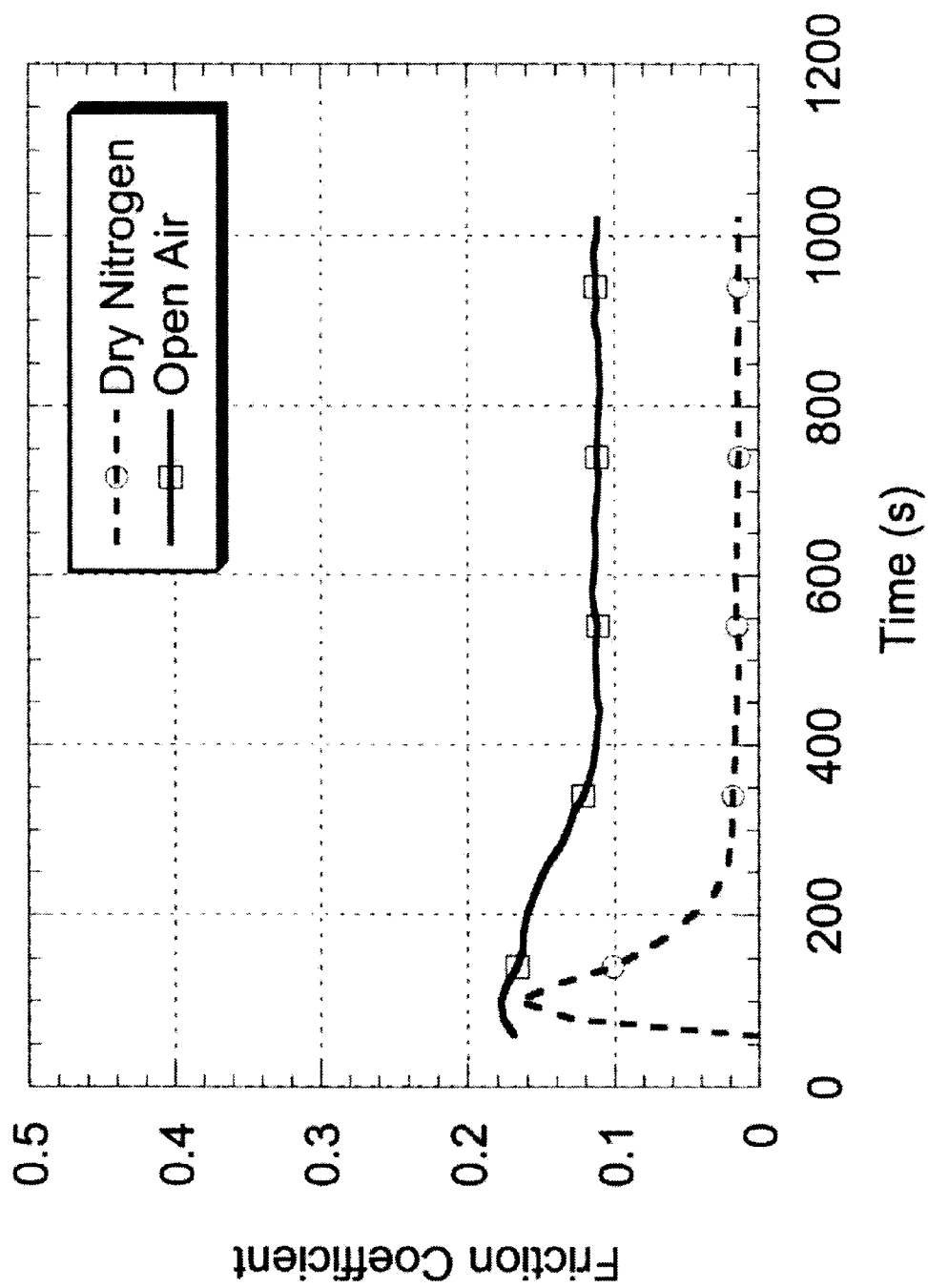
FIG. 14A illustrates the variation of friction coefficient in air and dry $N_2$ for short duration tests using 440C balls sliding against a DLC film prepared by ion beam deposition using a methane source gas and FIG. 14B is the friction coefficient as in 14A but using acetylene as the source gas.
Figure 14B:
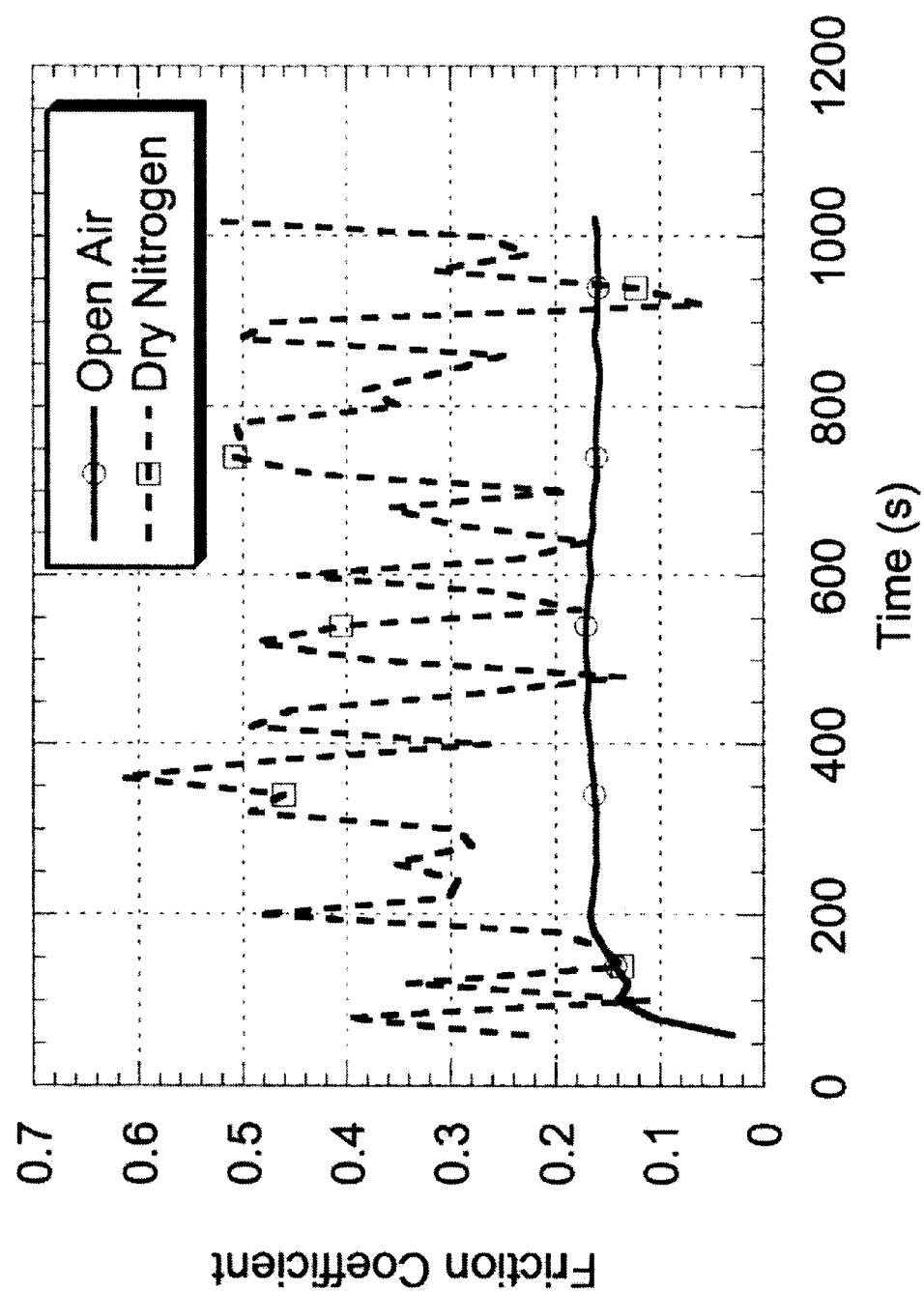

FIGS. 14A and B compare the frictional performance of methane- and acetylene-grown carbon films (grown by ion beam deposition) under mild wear test conditions during sliding in open air and dry $N_2$ environments. The friction coefficients of films grown using methane gas alone for the ion beam are 0.11 in open air but 0.02 in dry $N_2$ (see FIG. 14A). The acetylene-grown films, on the other hand, exhibit a steady-state friction coefficient of 0.16 in open air, but a very high and erratic friction coefficient in dry $N_2$ as shown in FIG. 14B. The friction coefficient of these films fluctuated between 0.1 and 0.6. Due to the large scatter, it was difficult to determine a steady-state friction value.

Figure 15A:
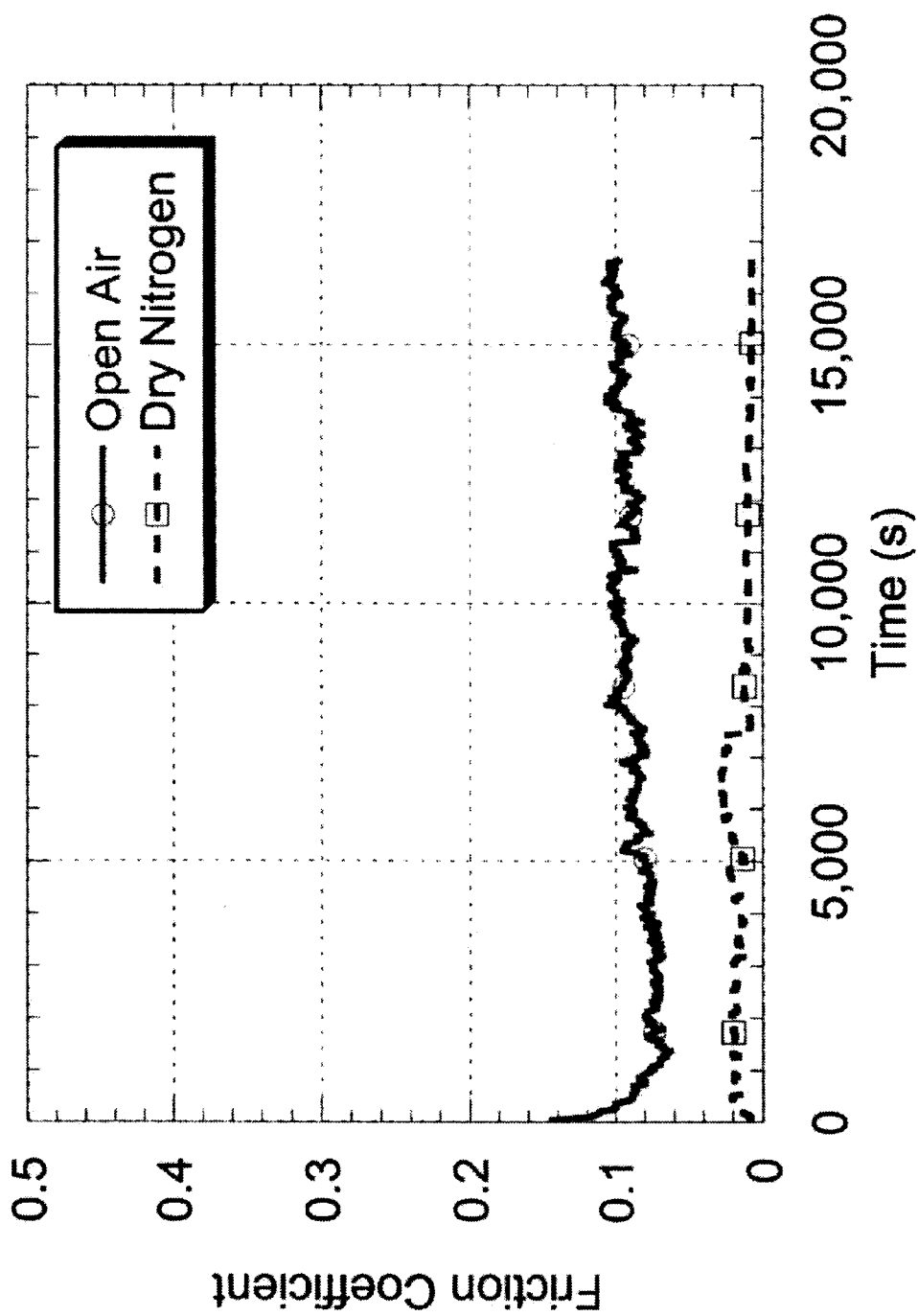
FIGS. 15A and 15B are the same as in FIGS. 14A and B, respectively, except for the tests being long duration tests.
Figure 15B:
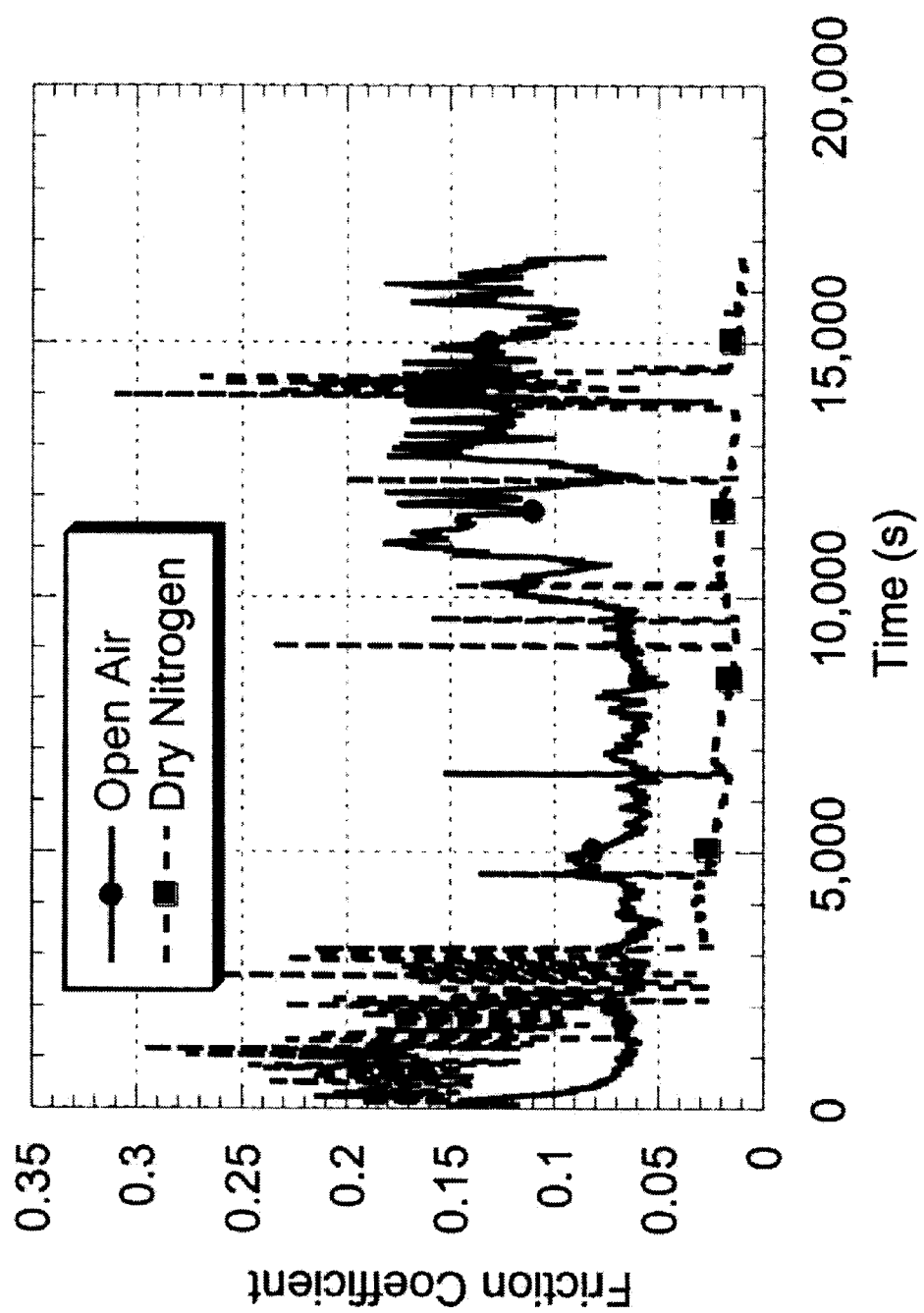

FIGS. 15A and 15B show the friction coefficients of methane-and acetylene-grown carbon films during sliding against 440C balls under severe wear conditions in open air and dry $N_2$. The carbon films grown in a methane plasma exhibited a steady-state friction coefficient of about 0.1 in air but 0.02 in dry $N_2$. Very little scatter was seen in the frictional data. The acetylene-produced films, on the other hand, again showed large scatter in their friction coefficients (i.e., values between 0.03 and 0.3) especially during sliding in dry $N_2$ (see FIG. 15B).

Figure 16:
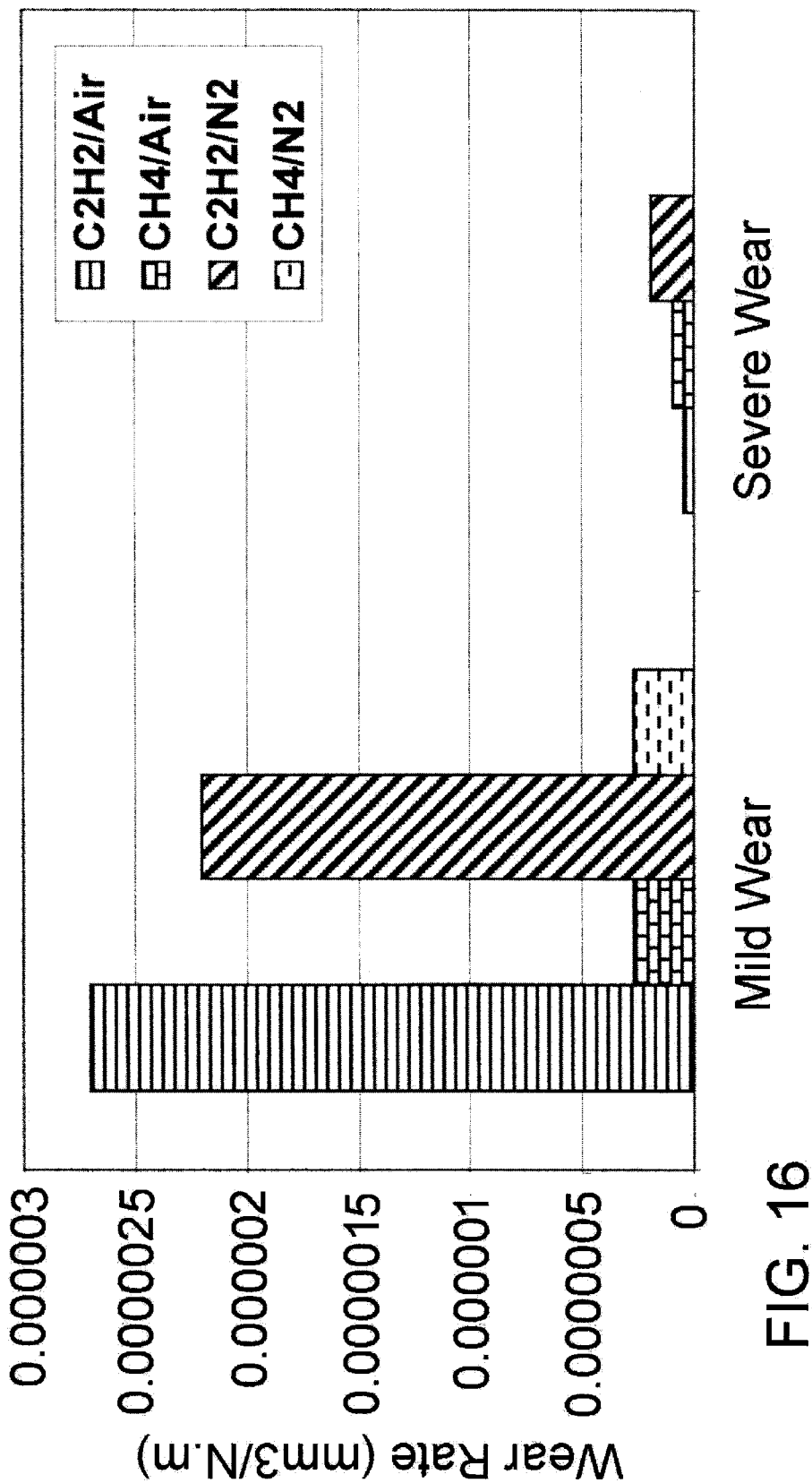
FIG. 16 illustrates wear rates of 440C balls sliding against methane and acetylene grown DLC films whose friction coefficients are described in FIGS. 14 and 15.

FIG. 16 compares the wear rates of 440C balls for both the mild and severe wear test conditions. It is clear that the carbon films produced from methane caused much lower wear on 440C balls than the films produced from acetylene. Table 9 lists the actual ball wear rates for all of the tests.

Figure 17A:
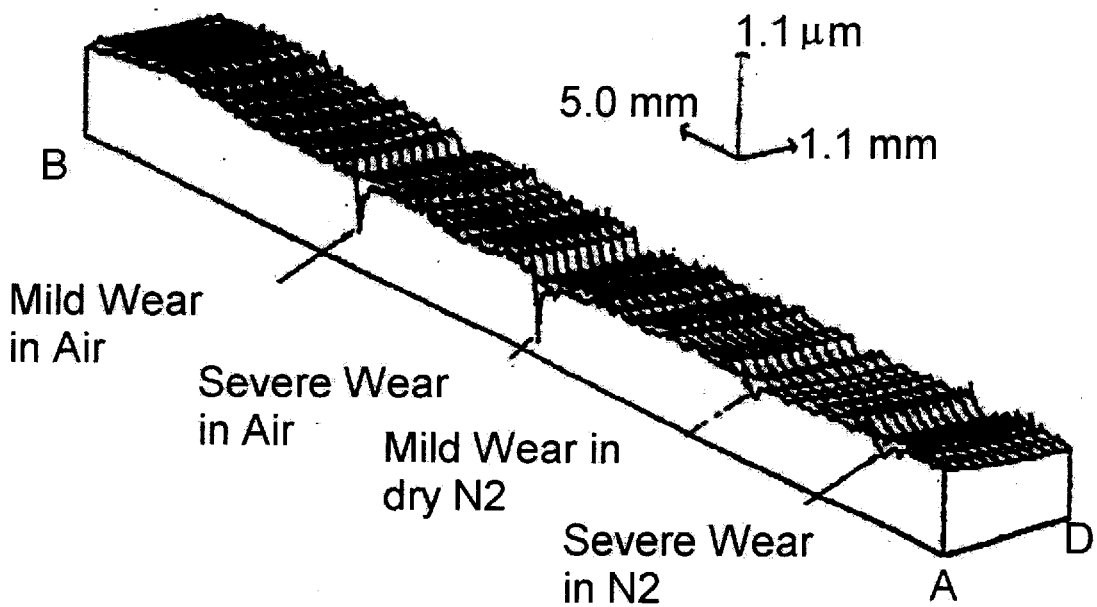
FIG. 17A illustrates isometric views of wear tracks on a DLC film obtained by ion beam deposition using a methane source gas and FIG. 17B shows wear tracks on a DLC film obtained using an acetylene source gas.

FIG. 17A is a three-dimensional view of the wear tracks formed on methane-produced carbon film under mild and severe wear conditions. The two deeper grooves on the left are from the tests performed in open air, and the two on the right are from tests done in a dry $N_2$ environment. It is important to note that regardless of the sliding distance, the amount of wear is very low when tests are performed in dry $N_2$, while the wear is rather significant during testing in open air.

Figure 17B:
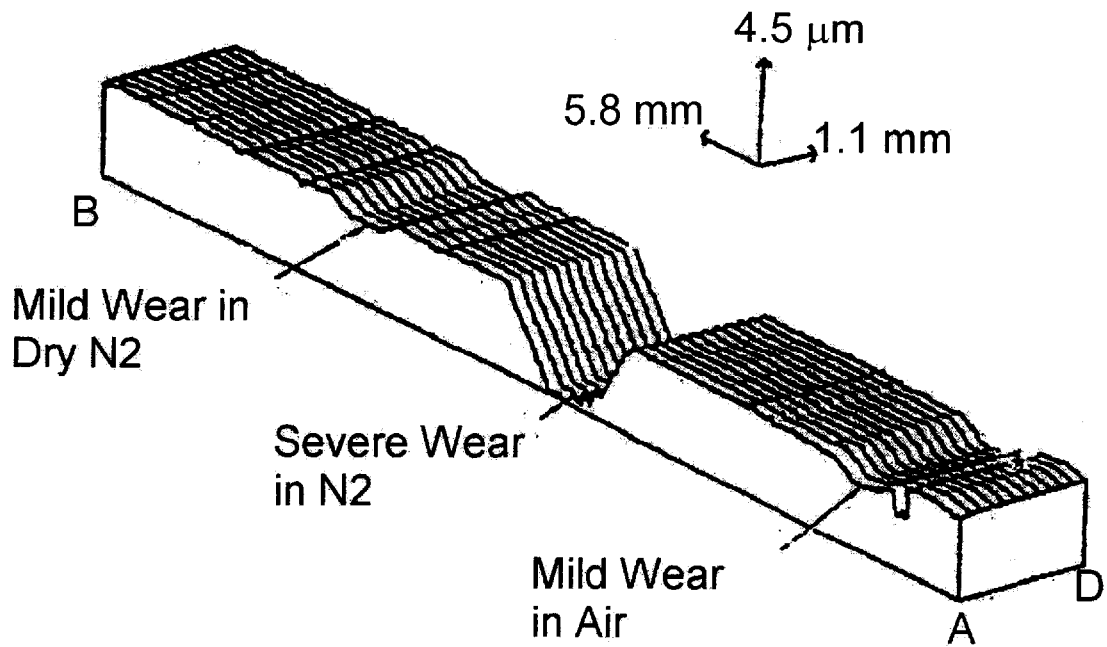

FIG. 17B is a three-dimensional view of the wear tracks formed on the carbon films derived from acetylene gas for the ion deposition method. The latter wear track in the middle is from a severe wear test performed in dry $N_2$, and the groove on the far right is from a mild wear test run in open air. The film appears to have worn through during the severe wear regime in dry $N_2$. The thickness of this film was about 4 $\mu$m.

Example VI

Figure 18A:
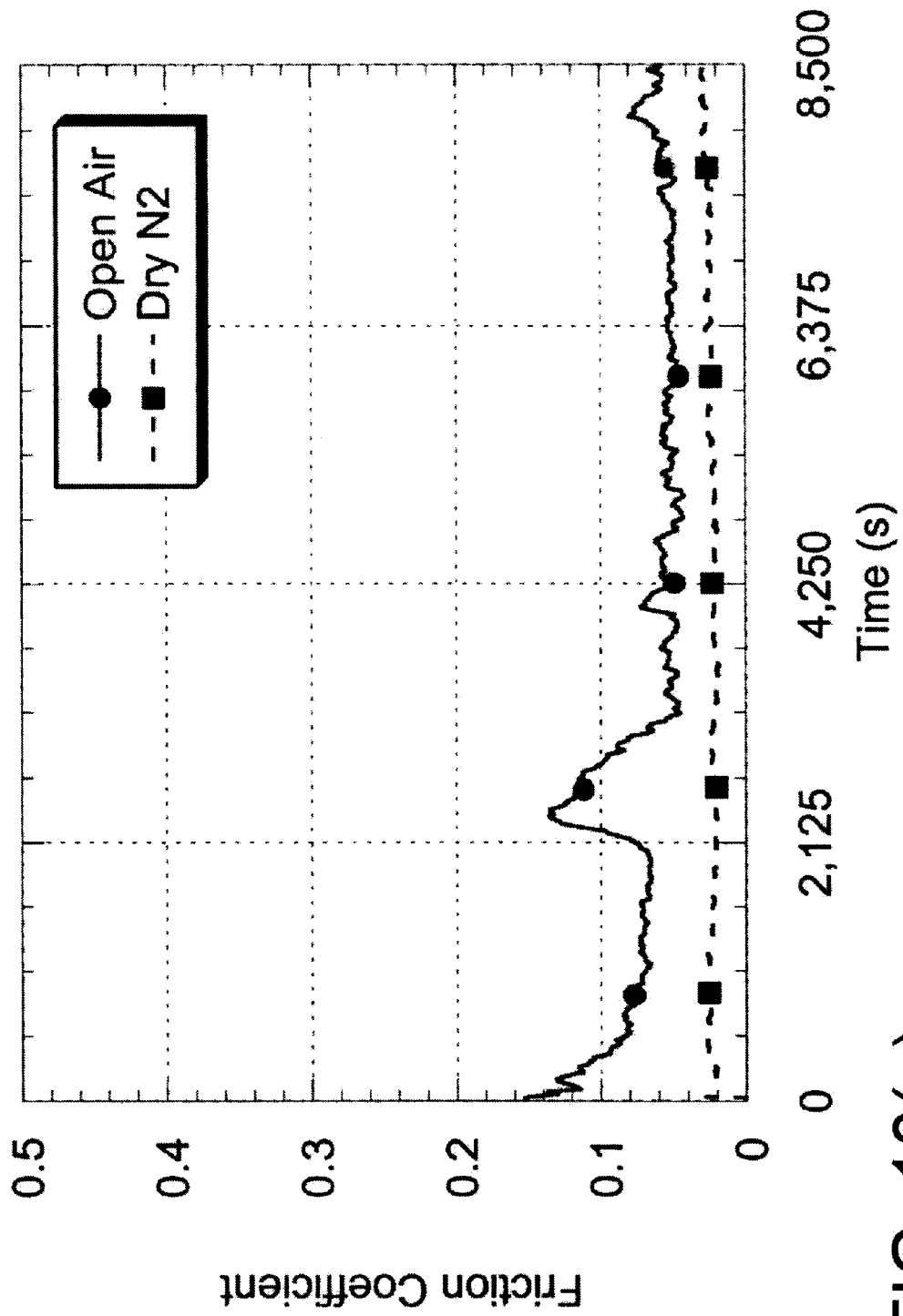
FIG. 18A illustrates variation of friction coefficients for long duration tests in $N_2$ with 440C balls sliding against DLC films prepared by an arc plasma method using methane alone.
Figure 18B:
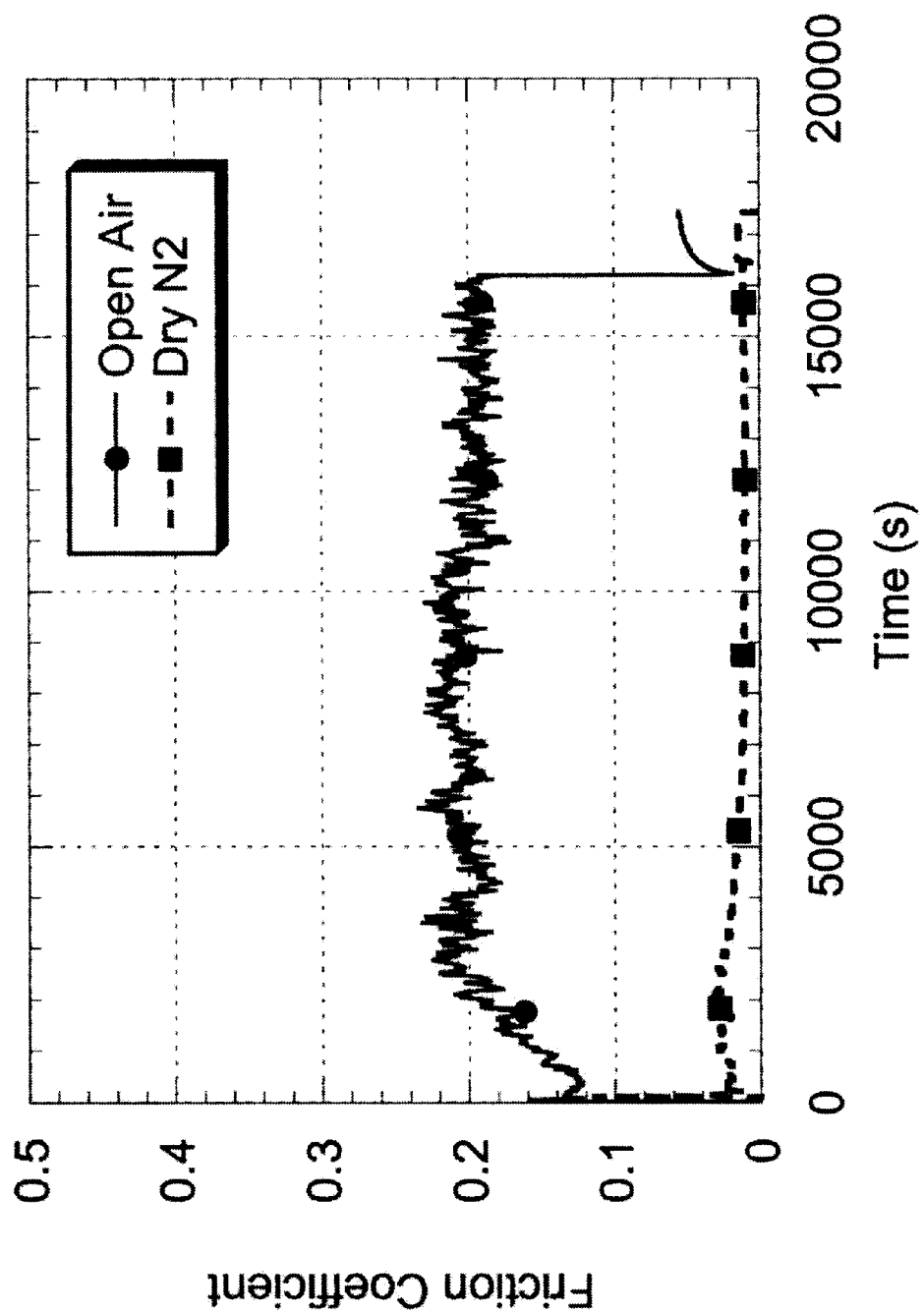
FIG. 18B is the same as in FIG. 18A but for a 75% methane/25% $H_2$ plasma.
Figure 18C:
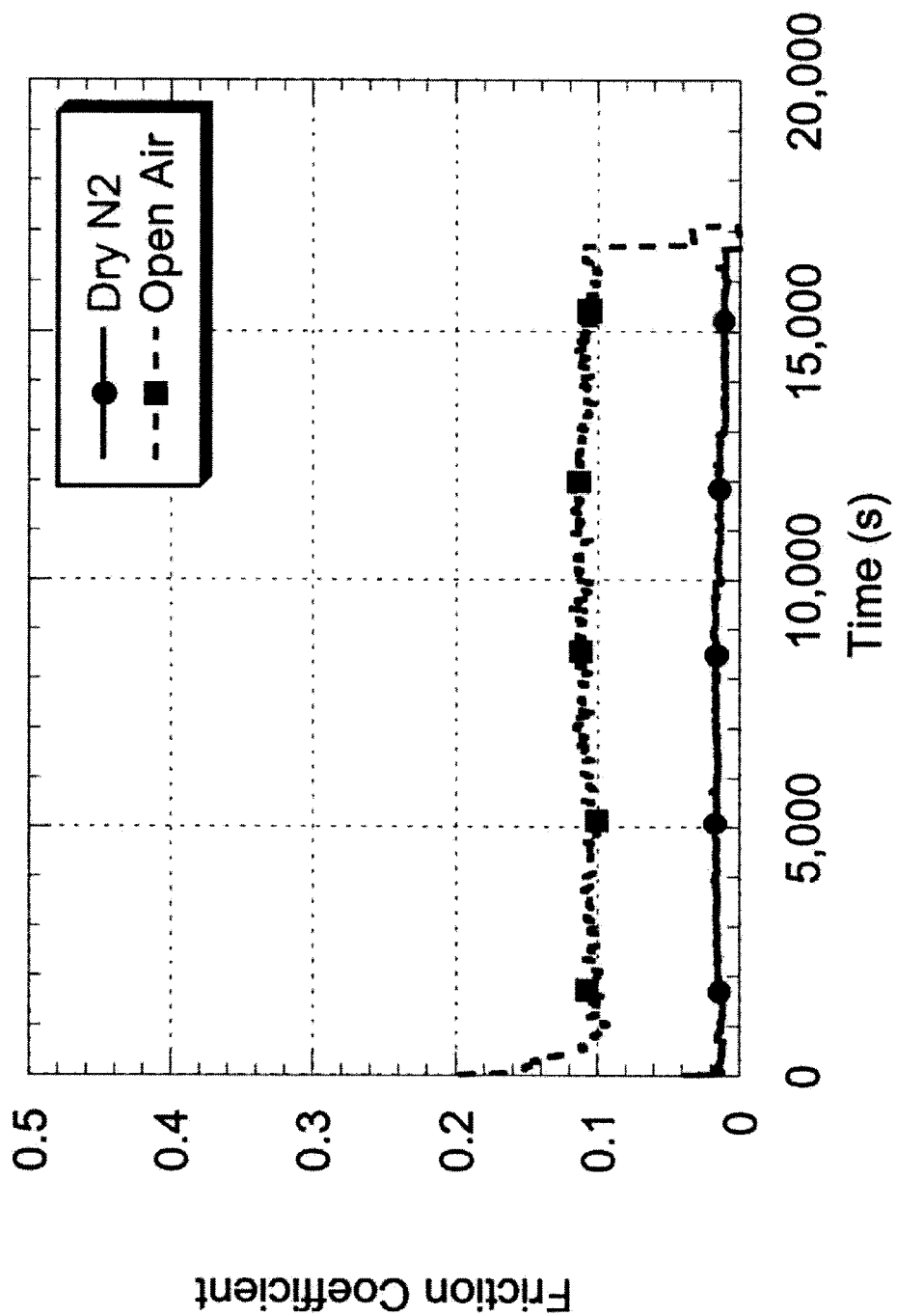
FIG. 18C is the same as in FIG. 18A but for a 50% methane/50% $H_2$ plasma.

In another example using the method of Example I, diamond-like carbon films were prepared from a gas atmosphere of pure methane, 75% methane+25% $H_2$, and 50% methane+50% $H_2$. These films were tested only under severe wear conditions to check their durability and friction performance under more stringent tribological conditions. The friction results are presented in FIGS. 18A, B and C, while the wear data are given in Table 9. It is clear that the friction performance of the carbon film grown from pure methane by plasma deposition is similar to that of carbon film grown from methane by ion-beam deposition (compare FIG. 15A with FIG. 18A). Furthermore, the wear rates of 440C balls sliding against these carbon films were very similar in air (see Table 9). This observation suggests that both ion-beam and plasma deposition processes can produce films with comparable tribological quality. In other words, as long as the source gas has the proper carbon to hydrogen ratio (i.e., the very low ratio described in detail hereinbefore), the difference in deposition process does not appear to cause major differences in tribological performance. However, in general the friction coefficients of films grown in 75% methane+25% $H_2$, and 50% methane+50% $H_2$ are much lower in dry $N_2$ see FIGS. 18B and C, respectively) than in air. Thus, in general, increasing the amount of hydrogen in the gas discharge plasma, and even potentially retained in the carbon films, appears to have a beneficial effect on the frictional performance of the resultant carbon films in dry $N_2$. More importantly, the friction coefficients decreased to very low values in certain ranges of hydrogen to carbon ratio.

TABLE 9

Wear rates (mm$^3$/N- m) of 440C balls during sliding against different DLC films.

| Deposition and Test Condition | Mild Wear Conditions | Severe Wear Conditions |
| --- | --- | --- |
| IBD-C$_2$H$_2$-Grown, Tested in Air | 2.7 × 10$^{-6}$ | 3.65 × 10$^{-8}$ |
| IBD CH$_4$-Grown, Tested in Air | 2.78 × 10$^{-7}$ | 3.23 × 10$^{-9}$ |
| IBD-C$_2$H$_2$-Grown, Tested in Dry N$_2$ | 2.24 × 10$^{-6}$ | 1.92 × 10$^{-7}$ |

TABLE 9-continued

Wear rates (mm³/N- m) of 440C balls during sliding against different DLC films.

| Deposition and Test Condition | Mild Wear Conditions | Severe Wear Conditions |
|---|---|---|
| IBD-CH$_4$-Grown, Tested in Dry N$_2$ | 2.73 × 10$^{-7}$ | 1.22 × 10$^{-9}$ |
| Plasma deposited in CH$_4$, Tested in Air | 4.7 × 10$^{-3}$ | 2.08 × 10$^{-9}$ |
| Plasma deposited in CH$_4$, Tested in Dry N$_2$ | 4.4 × 10$^{-8}$ | — |
| Plasma deposited in 75% CH$_4$-25% H$_2$, Tested in Air | — | 3.02 × 10$^{-10}$ |
| Plasma deposited in 75% CH$_4$-25% H$_2$, Tested in Dry N$_2$ | — | 4.2 × 10$^{-10}$ |
| Plasma deposited in 50% CH$_4$-50% H$_2$ Tested in Air | — | 6.6 × 10$^{-10}$ |
| Plasma deposited in 50% CH$_4$-50% H$_2$ Tested in Dry N$_2$ | — | 1.9 × 10$^{-10}$ |

While preferred embodiments of the invention have been shown and described, it will be clear to those skilled in the art that various changes and modifications can be made without departing from the invention in its broader aspects as set forth in the claims provided hereinafter.

What is claimed is:

1. A structurally amorphous, low friction coating, comprising: a film comprised of carbon and hydrogen, wherein the film has a coefficient of friction from 0.001 to 0.007 and the coefficient of friction is measured in a substantially clean nitrogen environment.

2. The structurally amorphous, low friction coating of claim 1, further wherein the film has a wear rate from about 10$^{-10}$ to 5×10$^{-11}$ cubic millimeters per Newton meter and the wear rate is measured in a dry, inert environment.

3. The structurally amorphous, low friction coating of claim 1, wherein the film is deposited on a substrate and the substrate is comprised of metal, ceramic, polymer, plastic, sapphire or a semiconductor.

4. The structurally amorphous, low friction coating of claim 3, wherein the film is deposited on the substrate by ion-beam deposition, DC sputtering, RF sputtering, arc-plasma deposition, plasma enhanced chemical vapor deposition, or laser ablation.

5. The structurally amorphous, low friction coating of claim 1, wherein the film is deposited on a bonding layer and the bonding layer is comprised of silicon.

6. The structurally amorphous, low friction coating of claim 5 wherein the bonding layer is 50 to 70 nm thick.

7. The structurally amorphous, low friction coating of claim 1, wherein the film is deposited on a bonding layer comprised of SiO$_2$, chromium oxide or titanium oxide.

8. The structurally amorphous, low friction coating of claim 1, wherein the film is about 1–2 or 4 micrometers thick.

9. The structurally amorphous, low friction coating of claim 1, wherein the film comprises about 30 to 40 mole percent hydrogen.

10. An article of manufacture, comprising:
    (a) a substrate comprised of metal, ceramic, polymer, plastic, sapphire or a semiconductor;
    (b) a bonding layer comprised of silicon, titanium oxide or chromium oxide deposited on the substrate; and
    (c) a film comprised of carbon and hydrogen deposited on the bonding layer, wherein the film has a coefficient of friction from 0.001 to 0.007 and the coefficient of friction is measured in a substantially clean nitrogen environment.

11. The article of manufacture of claim 10, further wherein the film has a wear rate from about 10$^{-10}$ to 5×10$^{-11}$ cubic millimeters per Newton meter and the wear rate is measured in a dry, inert environment.

12. The article of manufacture of claim 10 wherein the bonding layer is 50 to 70 nm thick.

13. The article of manufacture of claim 10, wherein the film is about 1–2 or 4 micrometers thick.

14. The article of manufacture of claim 10, wherein the film comprises about 30 to 40 mole percent hydrogen.

15. The article of manufacture of claim 10, wherein the film is deposited on the substrate by ion-beam deposition, DC sputtering, RF sputtering, arc-plasma deposition, plasma enhanced chemical vapor deposition, or laser ablation.

16. A structurally amorphous, low friction coating, comprising: a film consisting essentially of carbon and hydrogen, wherein the film has a coefficient of friction from 0.001 to 0.007 and the coefficient of friction is measured in a substantially clean nitrogen environment.

* * * * *

UNITED STATES PATENT AND TRADEMARK OFFICE
CERTIFICATE OF CORRECTION

PATENT NO.    : 6,548,173 B2
DATED         : April 15, 2003
INVENTOR(S)   : Ali Erdemir et al.

It is certified that error appears in the above-identified patent and that said Letters Patent is hereby corrected as shown below:

<u>Title page, Item [54] and Column 1, line 1,</u>
Title, "METHOD OF PRODUCE" is corrected to -- METHOD TO PRODUCE --.

<u>Title page,</u>
Item [73], Assignee, "Argonne National Laboratory, Argonne IL (US)" is corrected to -- University of Chicago, Chicago, IL (US) --.

<u>Column 1,</u>
Line 34, "temperature" is changed to -- temperatures --.
Line 35, "coating" is changed to -- coatings --.

<u>Column 2,</u>
Line 65, "illustrate" is changed to -- illustrates --.

<u>Column 3,</u>
Line 1, "illustrate" is changed to -- illustrates --.
Line 4, "tested dry" is changed to -- tested in dry --.

<u>Column 4,</u>
Table 1, under the heading titled "Air",
Item 5, is changed to -- 4.14E-08 --.
Item 6, is changed to -- 4.20E-08 --.
Item 10, is changed to -- 2.73E-05 --.

<u>Column 9,</u>
Table 6, "N-m" contained in a subheading is changed to -- N•m --.

<u>Column 10,</u>
Table 6-contained, "N-m" contained in a subheading is changed to -- N•m --.
Table 7, "N-m" contained in a subheading is changed to -- N•m --.
Table 8, "N-m" contained in a subheading is changed to -- N•m --.

UNITED STATES PATENT AND TRADEMARK OFFICE
CERTIFICATE OF CORRECTION

PATENT NO. : 6,548,173 B2
DATED : April 15, 2003
INVENTOR(S) : Ali Erdemir et al.

It is certified that error appears in the above-identified patent and that said Letters Patent is hereby corrected as shown below:

<u>Column 12,</u>
Table 9, "N-m" contained in a subheading is changed to -- N•m --.

<u>Column 13,</u>
Table 9-continued, "N-m" contained in a subheading is changed to -- N•m --.

Signed and Sealed this

Sixth Day of April, 2004

JON W. DUDAS
*Acting Director of the United States Patent and Trademark Office*